(12) United States Patent
Lee et al.

(10) Patent No.: US 11,733,816 B2
(45) Date of Patent: Aug. 22, 2023

(54) DISPLAY DEVICE

(71) Applicant: Samsung Display Co., Ltd., Yongin-si (KR)

(72) Inventors: Soojung Lee, Suwon-si (KR); Yuna Kim, Seoul (KR); Seungwook Chun, Daegu (KR); Boram Choi, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/849,284

(22) Filed: Jun. 24, 2022

(65) Prior Publication Data
US 2023/0030034 A1 Feb. 2, 2023

(30) Foreign Application Priority Data

Jul. 29, 2021 (KR) .................. 10-2021-0099802

(51) Int. Cl.
G06F 3/044 (2006.01)
G06F 3/041 (2006.01)
(52) U.S. Cl.
CPC .......... G06F 3/0445 (2019.05); G06F 3/0446 (2019.05); G06F 3/04164 (2019.05)
(58) Field of Classification Search
CPC combination set(s) only.
See application file for complete search history.

(56) References Cited

U.S. PATENT DOCUMENTS 11,157,102 B2 * 10/2021 Lee .................. G06F 3/0448
2018/0329555 A1 * 11/2018 Kim .................. G06F 3/0443
2021/0004135 A1 1/2021 Kim et al.
2021/0043693 A1 2/2021 Kim et al.
2021/0141491 A1 * 5/2021 Gogte .................. G06F 3/0412
2023/0094766 A1 * 3/2023 Gong .................. G06F 3/0412
345/173

FOREIGN PATENT DOCUMENTS

KR 10-2020-0143627 12/2020
KR 10-2021-0003986 1/2021
KR 10-2021-0018702 2/2021

OTHER PUBLICATIONS

Eun Young Choi, "Comparison of State of Skin Surface using skin Instrumental Measurements", Kimcheon Science College, pp. 1-10, Republic of Korea.

* cited by examiner

Primary Examiner — Deeprose Subedi
(74) Attorney, Agent, or Firm — H.C. Park & Associates, PLC

(57) ABSTRACT

A display device includes a display panel and an input sensor disposed on the display panel. The input sensor includes a first electrode, a second electrode, and a third electrode. The first electrode includes a first sensing pattern having a first opening defined therein. The second electrode includes a second sensing pattern having a second opening defined therein. The third electrode includes a first sub-sensing pattern disposed in the first opening of the first sensing pattern, and a second sub-sensing pattern disposed in the second opening of the second sensing pattern. The first sub-sensing pattern and the second sub-sensing pattern are electrically connected with each other. The first electrode, the second electrode, and the third electrode are insulated from one another.

20 Claims, 25 Drawing Sheets

DISPLAY DEVICE

CROSS-REFERENCE TO RELATED APPLICATIONS

This application claims priority to and the benefit of Korean Patent Application No. 10-2021-0099802, filed Jul. 29, 2021, which is hereby incorporated by reference for all purposes as if fully set forth herein.

BACKGROUND

Field

One or more embodiments generally relate to a display device.

Discussion

Multimedia electronic devices, such as a television, a mobile phone, a tablet computer, a navigation system, a game machine, and the like, may include a display device for displaying an image. Further, electronic devices may include a display device capable of providing a touch-based input method that enables a user to intuitively input information or instructions in an easy and simple manner, in addition to a conventional input method, such as a button, a keyboard, a mouse, or the like. Given that personal electronic devices, such as mobile phones, are widely used, there is a growing need for a display device capable of sensing and displaying biometric information.

The above information disclosed in this section is only for understanding the background of the inventive concepts, and, therefore, may contain information that does not form prior art.

SUMMARY

Embodiments provide a display device capable of sensing biometric information of a user.

Additional aspects will be set forth in the detailed description which follows, and, in part, will be apparent from the disclosure, or may be learned by practice of the inventive concepts.

According to an embodiment, a display device includes a display panel and an input sensor disposed on the display panel. The input sensor includes a first electrode, a second electrode, and a third electrode. The first electrode includes a first sensing pattern having a first opening defined therein. The second electrode includes a second sensing pattern having a second opening defined therein. The third electrode includes a first sub-sensing pattern disposed in the first opening of the first sensing pattern, and a second sub-sensing pattern disposed in the second opening of the second sensing pattern. The first sub-sensing pattern and the second sub-sensing pattern are electrically connected to each other. The first electrode, the second electrode, and the third electrode are insulated from one another.

According to an embodiment, a display device includes a display panel and an input sensor disposed on the display panel. The input sensor includes a first electrode, a second electrode, a third electrode, and a fourth electrode. The first electrode includes a first sensing pattern having a first opening defined therein. The second electrode includes a second sensing pattern having a second opening defined therein. The third electrode includes a first sub-sensing pattern disposed in the first opening of the first sensing pattern, and a second sub-sensing pattern disposed in the second opening of the second sensing pattern. The fourth electrode includes a third sub-sensing pattern disposed in the first opening of the first sensing pattern, and a fourth sub-sensing pattern disposed in the second opening of the second sensing pattern. The first sub-sensing pattern and the second sub-sensing pattern are electrically connected to each other. The third sub-sensing pattern and the fourth sub-sensing pattern are electrically connected to each other. The first electrode, the second electrode, the third electrode, and the fourth electrode are insulated from one another.

The foregoing general description and the following detailed description are illustrative and explanatory and are intended to provide further explanation of the claimed subject matter.

BRIEF DESCRIPTION OF THE FIGURES

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION OF SOME EMBODIMENTS

Figure 1:
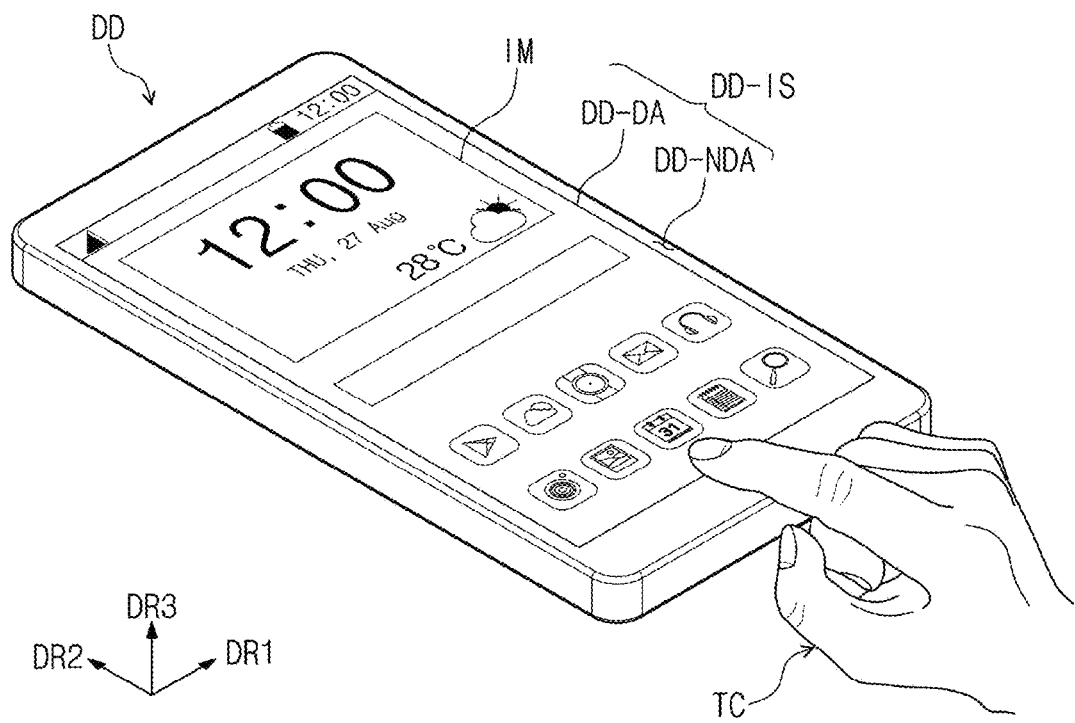
FIG. 1 is a perspective view of a display device according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

FIG. 1 is a perspective view of a display device DD according to an embodiment.

As illustrated in FIG. 1, the display device DD may display an image IM through a display surface DD-IS. The display surface DD-IS is parallel to a plane defined by a first directional axis DR1 and a second directional axis DR2. A normal direction of the display surface DD-IS, e.g., a thickness direction of the display device DD, is indicated by a third directional axis DR3.

Front surfaces (or upper surfaces) and rear surfaces (or lower surfaces) of parts or members described below are distinguished from each other by the third directional axis DR3; however, the first, second, and third directional axes DR1, DR2, and DR3 are merely illustrative. Hereinafter, first, second, and third directions are defined as directions indicated by the first, second, and third directional axes DR1, DR2, and DR3, respectively, and will be referred to by the same reference numerals.

Although the display device DD having a flat display surface is illustrated in FIG. 1 as merely an example, embodiments are not limited thereto. For instance, the display device DD may further include a curved display surface. The display device DD may include a three-dimensional display surface. The three-dimensional display surface may include a plurality of display areas indicating different directions and may include, for example, a polygonal prismatic display surface.

The display device DD according to an embodiment may be a rigid display device; however, without being limited thereto, the display device DD may be a flexible display device. The flexible display device may include a foldable (or flexible) display device that can be folded or flexed, a bending-type display device, a partial area of which is or can be bent, or a slidable display device including, for instance, one or more portions that can be slid relative to one or more other portions.

The display device DD incorporated as part of a mobile phone terminal is illustrated as an example in FIG. 1, but embodiments are not limited thereto. In some embodiments, electronic modules, a camera module, a power module, and/or the like, may be mounted on a main board and may be disposed in a bracket/case together with the display DD to configure a mobile phone terminal. The display device DD according to some embodiments may be applied to small and medium-sized electronic devices, such as a tablet computer, a car navigation system, a game machine, a smart watch, etc., as well as may be applied to large electronic devices, such as a television, a monitor, etc.

As illustrated in FIG. 1, the display surface DD-IS includes an image area DD-DA on which the image IM is displayed, and a bezel area DD-NDA adjacent to the image area DD-DA. The bezel area DD-NDA is an area where no image is displayed. In FIG. 1, clock and icon images are illustrated as an example of the image IM.

As illustrated in FIG. 1, the image area DD-DA may have a substantially quadrilateral shape. The "substantially quadrilateral shape" includes not only a quadrilateral shape in a mathematical sense, but may refer to a quadrilateral shape in which curved boundaries rather than vertexes are defined in vertex areas (or corner areas). It is also contemplated that the display device DD may have other shapes, such as polygonal, circular, etc.

The bezel area DD-NDA may surround the image area DD-DA. However, without being limited thereto, the image area DD-DA and the bezel area DD-NDA may be designed in a different shape. The bezel area DD-NDA may be disposed on only one side of the image area DD-DA. The bezel area DD-NDA may not be exposed to the outside depending on a form in which the display device DD is coupled with another component of an electronic device.

The display device DD according to an embodiment may sense a user's input TC applied from the outside. The display device DD may sense the user's input TC by sensing a change in reflected light, temperature, pressure, ultrasonic waves, electromagnetism, or a combination thereof caused by the user's input TC. The following description will be given under the assumption that the user's input TC is a touch input applied to a front surface of the display device DD by the user's hand. However, this is merely illustrative, and the user's input TC may be provided in various forms, such as described above. Furthermore, the display device DD may sense the user's input TC applied to a side surface or a rear surface of the display device DD depending on a structure of the display device DD, but is not limited to any one embodiment.

In addition, the display device DD according to an embodiment may sense an input by an electronic pen. The electronic pen may be an input device using a tool, such as a stylus pen, an electronic pen, an active pen, etc.

Figure 2:
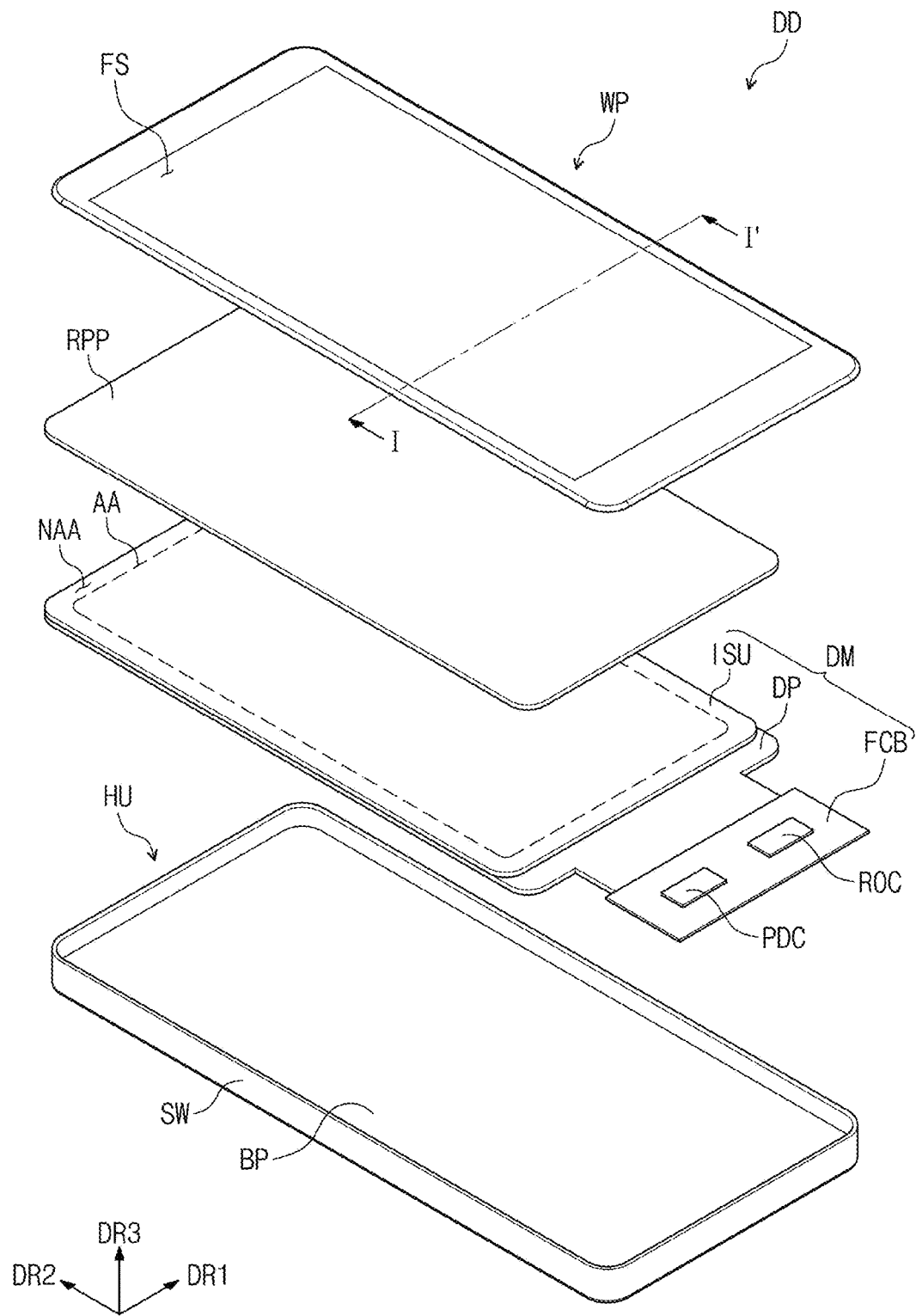
FIG. 2 is an exploded perspective view of the display device of FIG. 1 according to an embodiment.

FIG. 2 is an exploded perspective view of the display device of FIG. 1 according to an embodiment.

Referring to FIG. 2, the display device DD may include a window WP, an anti-reflector RPP, a display module DM, and a housing HU. As illustrated in FIGS. 1 and 2, in an embodiment, the window WP and the housing HU are combined to form the exterior of the display device DD.

The window WP protects an upper surface of the display panel DP. The window WP may contain an optically clear insulating material. For example, the window WP may include a front surface FS containing glass and/or plastic. The window WP may have a multi-layer structure or a single-layer structure. For example, the window WP may include a plurality of plastic films coupled through an adhesive, or may include a glass substrate and a plastic film coupled through an adhesive.

The anti-reflector RPP may be disposed under the window WP. The anti-reflector RPP decreases the reflectivity of external light incident from above the window WP. In an embodiment, the anti-reflector RPP may be omitted, or may be embedded in or as part of the display module DM.

The display module DM may display the image IM and may sense an external input. The display module DM may include a display panel DP, an input sensor ISU, and a printed circuit board FCB.

An active area AA and a peripheral area NAA corresponding to the image area DD-DA and the bezel area DD-NDA illustrated in FIG. 1 may be defined in the display module DM. The display panel DP may be a component that substantially generates the image IM. The image IM generated by the active area AA of the display panel DP is visible to the user through the window WP. The display panel DP may include a pad area PP (see FIG. 6). The pad area PP may be part of the peripheral area NAA.

The input sensor ISU senses an external input applied from the outside, such as the user's input TC. As described above, the input sensor ISU may sense an external input provided to the window WP.

The display panel DP may be electrically connected with the printed circuit board FCB. In an embodiment, a driver integrated circuit (IC) generating signals for operation of the display panel DP may be mounted on the display panel DP.

The printed circuit board FCB may include various drive circuits for driving the display panel DP and the input sensor ISU or a connector for supply of power. In an embodiment, the printed circuit board FCB may include a panel drive circuit PDC for driving the display panel DP and a readout circuit ROC for driving the input sensor ISU. The panel drive circuit PDC and the readout circuit ROC may be formed as integrated circuits and may be mounted on the printed circuit board FCB. In an embodiment, the panel drive circuit PDC and the readout circuit ROC may be implemented as one integrated circuit.

The housing HU includes a bottom part BP and a sidewall SW. The sidewall SW may extend from the bottom part BP. The housing HU may accommodate the display panel DP in a receiving space defined by the bottom part BP and the sidewall SW. The window WP may be coupled with the sidewall SW of the housing HU. The sidewall SW of the housing HU may support the periphery of the window WP.

The housing HU may contain a material having a relatively high rigidity. For example, the housing HU may contain glass, plastic, and/or metal. In some embodiment, the housing HU may include a plurality of frames and/or plates formed of a combination of the mentioned materials. The housing HU may stably protect components of the display device DD accommodated in the inner space from an external impact, debris, contaminant, and/or the like.

Figure 3:
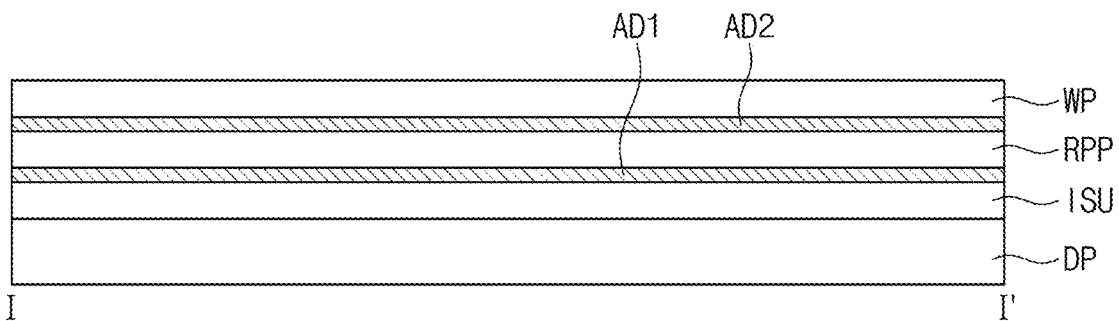
FIG. 3 is a sectional view taken along sectional line I-I' illustrated in FIG. 2 according to an embodiment.
Figure 3:
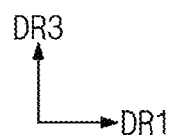

FIG. 3 is a sectional view taken along sectional line I-I' illustrated in FIG. 2 according to an embodiment.

FIG. 3 illustrates a section of the display device DD defined by the first directional axis DR1 and the third directional axis DR3. In FIG. 3, components of the display device DD are simply illustrated to describe the stacking relationship therebetween.

The display device DD according to an embodiment may include the display panel DP, the input sensor ISU, the anti-reflector RPP, and the window WP. At least some of the display panel DP, the input sensor ISU, the anti-reflector RPP, and the window WP may be formed by a continuous process, or may be coupled together through an adhesive member. For example, the input sensor ISU and the anti-reflector RPP may be coupled by an adhesive member AD1. The anti-reflector RPP and the window WP may be coupled by an adhesive member AD2.

The adhesive members AD1 and AD2 may be transparent adhesive members, such as a pressure sensitive adhesive (PSA) film, an optically clear adhesive (OCA) film, and/or an optically clear resin (OCR). Adhesive members to be described below may include a conventional adhesive or sticky substance. In an embodiment, the anti-reflector RPP and the window WP may be replaced with other components, or may be omitted.

In FIG. 3, among the input sensor ISU, the anti-reflector RPP, and the window WP, the input sensor ISU formed with the display panel DP through a continuous process is directly disposed on the display panel DP. The expression "a component B is directly disposed on a component A" as used herein means that a separate adhesive layer/adhesive member is not disposed between the component A and the component B. The component B is formed, through a continuous process, on a base surface provided by the component A after the component A is formed.

In an embodiment, the anti-reflector RPP and the window WP are of a "panel" type, and the input sensor ISU is of a "layer" type. The "panel" type may include a base layer (e.g., a synthetic resin film, a composite film, a glass substrate, and/or the like) that provides a base surface, whereas the "layer" type may not include the base layer. In other words, components of a "layer" type are disposed on a base surface provided by another component. In an embodiment, the anti-reflector RPP and the window WP may be of a "layer" type.

The display panel DP generates an image, and the input sensor ISU obtains coordinate information of an external input (e.g., a touch event). In some embodiments, the display device DD may further include a protective member disposed on a lower surface (or a rear surface) of the display panel DP. The protective member and the display panel DP may be coupled through an adhesive member.

The display panel DP according to an embodiment may be an emissive display panel, but is not limited thereto. For example, the display panel DP may be an organic light emitting display panel or a quantum dot light emitting display panel. The panels are distinguished from each other depending on constituent materials of light emitting elements. An emissive layer of the organic light emitting display panel may contain an organic light emitting material. An emissive layer of the quantum dot light emitting display panel may contain quantum dots, quantum rods, and/or the like. Hereinafter, it will be exemplified that the display panel DP is an organic light emitting display panel, but embodiments are not limited thereto.

The anti-reflector RPP decreases the reflectivity of external light incident from above the window WP. The anti-reflector RPP according to an embodiment may include a phase retarder and a polarizer. The phase retarder may be of a film type and/or a liquid-crystal coating type. The polarizer may also be of a film type and/or a liquid-crystal coating type. The film type may include a stretchable synthetic resin film, and the liquid-crystal coating type may include liquid crystals arranged in a predetermined arrangement. The phase retarder and the polarizer may further include a protective film. The phase retarder and the polarizer themselves or the protective film may be defined as a base layer of the anti-reflector RPP.

The anti-reflector RPP according to an embodiment may include color filters. The color filters have a predetermined arrangement. The arrangement of the color filters may be determined in consideration of emission colors of pixels included in the display panel DP. The anti-reflector RPP may further include a black matrix adjacent to the color filters.

The anti-reflector RPP according to an embodiment may include a destructive interference structure. For example, the destructive interference structure may include a first reflective layer and a second reflective layer disposed on different layers. First reflected light and second reflected light reflected by the first reflective layer and the second reflective layer, respectively, may destructively interfere with each other, and thus, the reflectivity of external light may be decreased.

The window WP according to an embodiment may include a glass substrate and/or a synthetic resin film. The window WP is not limited to a single layer. The window WP may include two or more films coupled by an adhesive member. In some embodiments, the window WP may further include a functional coating layer. The functional coating layer may include an anti-fingerprint layer, an anti-reflection layer, and/or a hard coating layer.

Figure 4:
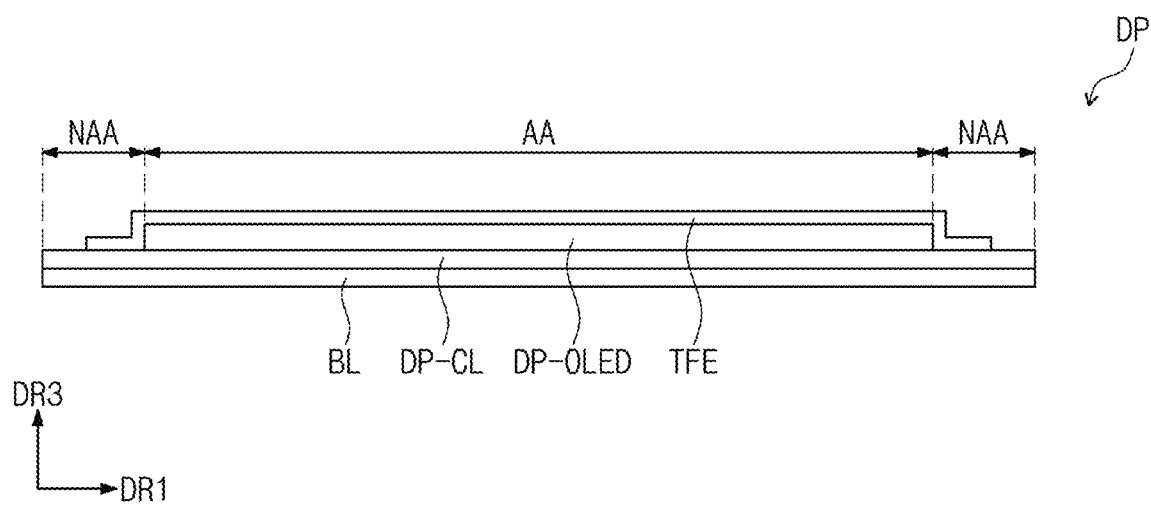
FIG. 4 is a sectional view of a display panel illustrated in FIG. 3 according to an embodiment.
Figure 4:
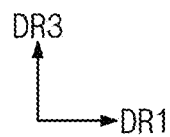

FIG. 4 is a sectional view of the display panel DP illustrated in FIG. 3 according an embodiment.

As illustrated in FIG. 4, the display panel DP includes a base layer BL, as well as a circuit element layer DP-CL, a light emitting element layer DP-OLED, and a thin-film encapsulation layer TFE that are disposed on the base layer BL. An active area AA and a peripheral area NAA corresponding to the image area DD-DA and the bezel area DD-NDA illustrated in FIG. 1 may be defined in the display panel DP. The expression "an area/portion corresponds (or corresponding) to an area/portion" as used herein means that "the areas/portions overlap each other," but is not limited to having the same area and/or the same shape.

The base layer BL may include at least one synthetic resin film. The base layer BL may include a glass substrate, a metal substrate, and/or an organic/inorganic composite substrate.

The circuit element layer DP-CL is disposed on the base layer BL. The circuit element layer DP-CL includes at least one insulating layer and circuit elements. The insulating layer includes at least one inorganic layer and at least one organic layer. The circuit elements may include signal lines and a pixel drive circuit.

The light emitting element layer DP-OLED is disposed on the circuit element layer DP-CL. The light emitting element layer DP-OLED may include organic light emitting diodes. The light emitting element layer DP-OLED may further include an organic layer, such as a pixel defining film.

The thin-film encapsulation layer TFE may be disposed on the light emitting element layer DP-OLED and may encapsulate the light emitting element layer DP-OLED. The thin-film encapsulation layer TFE may entirely cover the active area AA. The thin-film encapsulation layer TFE may cover part of the peripheral area NAA.

The thin-film encapsulation layer TFE includes a plurality of thin films. Some of the thin films are disposed to improve optical efficiency, and other thin films are disposed to protect the organic light emitting diodes.

Figure 5:
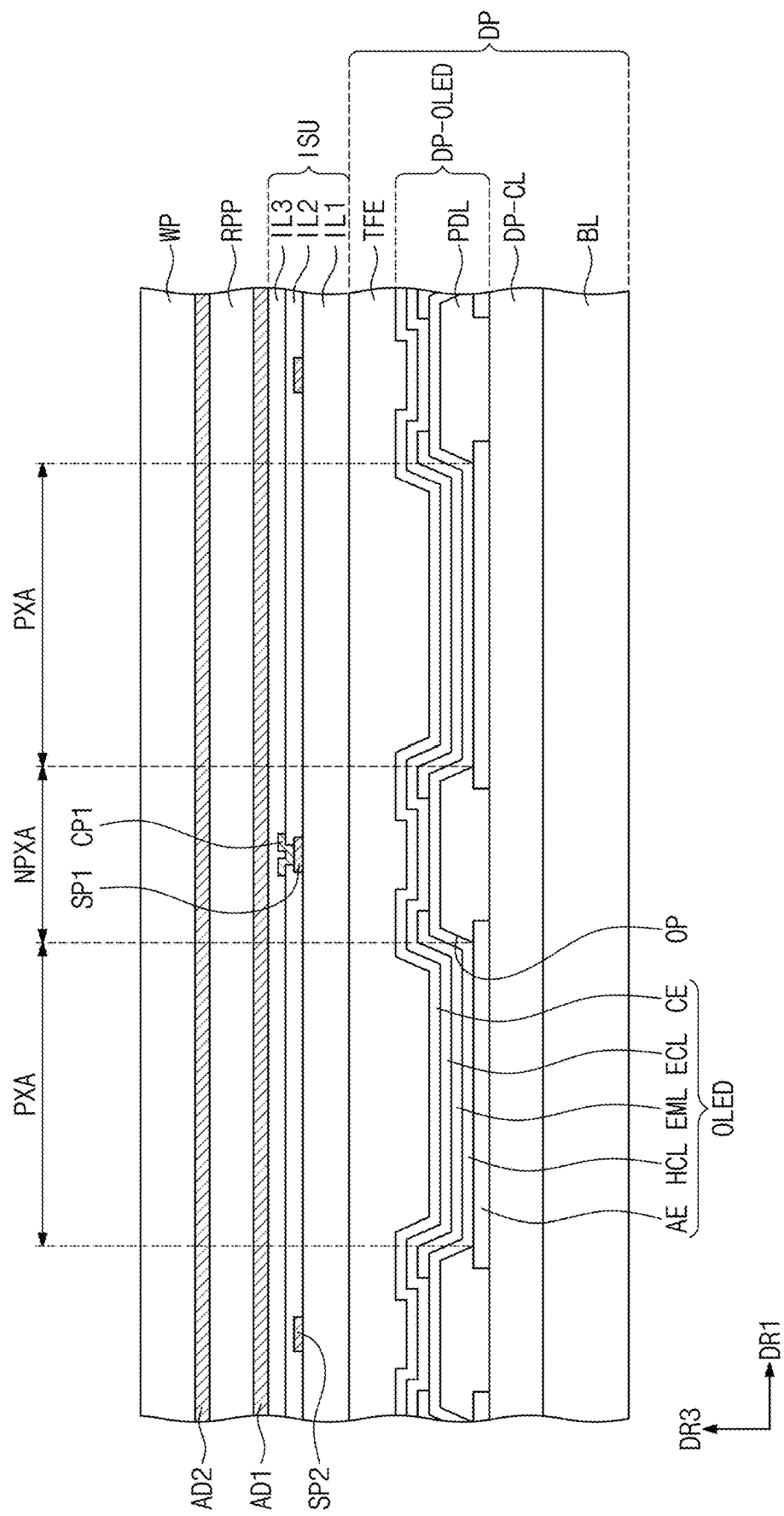
FIG. 5 is a sectional view of the display device of FIG. 1 according to an embodiment.

FIG. 5 is a sectional view of the display device of FIG. 1 according to an embodiment.

As illustrated in FIG. 5, the display panel DP includes the base layer BL, as well as the circuit element layer DP-CL, the light emitting element layer DP-OLED, and the thin-film encapsulation layer TFE that are disposed on the base layer BL. In some embodiments, the display panel DP may further include one or more functional layers, such as an anti-reflection layer, a reflective index control layer, and/or the like.

The base layer BL may include a synthetic resin film. A synthetic resin layer is formed on a working substrate used in manufacture of the display panel DP. Thereafter, a conductive layer and an insulating layer are formed on the synthetic resin layer. When the working substrate is removed, the synthetic resin layer corresponds to the base layer BL. The synthetic resin layer may be a polyimide-based resin layer, but a material thereof is not limited thereto. In addition, the base layer BL may include a glass substrate, a metal substrate, and/or an organic/inorganic composite substrate.

The circuit element layer DP-CL includes at least one insulating layer and a circuit element. Hereinafter, the insulating layer included in the circuit element layer DP-CL is referred to as an intermediate insulating layer. The intermediate insulating layer includes at least one intermediate inorganic film and at least one intermediate organic film. The circuit element includes a signal line and a pixel drive circuit. The circuit element layer DP-CL may be formed by forming an insulating layer, a semiconductor layer, and a conductive layer by coating, deposition, and/or the like and subjecting the insulating layer, the semiconductor layer, and the conductive layer to patterning by a photolithography process.

The light emitting element layer DP-OLED may include a pixel defining film PDL and organic light emitting diodes OLED. The pixel defining film PDL may contain an organic material. First electrodes AE are disposed on the circuit element layer DP-CL. The pixel defining film PDL is formed on the first electrodes AE. Openings OP are defined in the pixel defining film PDL. The openings OP of the pixel defining film PDL expose at least parts of the first electrodes AE. In an embodiment, the pixel defining film PDL may be omitted.

A hole control layer HCL may be disposed on the first electrodes AE. Emissive layers EML are disposed on the hole control layer HCL. The emissive layers EML may be disposed in areas corresponding to the openings OP. For instance, the emissive layers EML may be separately formed for the respective pixels PX (refer to FIG. 6). The emissive layers EML may contain an organic material and/or an inorganic material. The emissive layers EML may generate predetermined colored lights.

An electron control layer ECL is disposed on the emissive layers EML. A second electrode CE is disposed on the electron control layer ECL. The second electrode CE is commonly disposed for the pixels PX, but embodiments are not limited thereto.

The thin-film encapsulation layer TFE is disposed on the second electrode CE. The thin-film encapsulation layer TFE seals the light emitting element layer DP-OLED. The thin-film encapsulation layer TFE includes at least one insulating layer. The thin-film encapsulation layer TFE according to an embodiment may include at least one inorganic film (hereinafter, referred to as an inorganic encapsulation film). The thin-film encapsulation layer TFE according to an embodiment may include at least one organic film (hereinafter, referred to as an organic encapsulation film) and at least one inorganic encapsulation film.

The inorganic encapsulation film protects the light emitting element layer DP-OLED from moisture/oxygen, and the organic encapsulation film protects the light emitting element layer DP-OLED from foreign matter, such as dust particles. The inorganic encapsulation film may include, but is not limited to, a silicon nitride layer, a silicon oxy nitride layer, a silicon oxide layer, a titanium oxide layer, and/or an aluminum oxide layer. The organic encapsulation film may include, but is not limited to, an acrylate-based organic film.

The input sensor ISU includes a base layer IL1 as well as first and second conductive layers and first and second insulating layers IL2 and IL3 that are disposed on the base layer IL1. The base layer IL1 may contain an inorganic material. For example, the base layer IL1 may include a silicon nitride layer. An inorganic film disposed at the top of the thin-film encapsulation layer TFE may also include a silicon nitride layer, and the silicon nitride layer of the thin-film encapsulation layer TFE and the base layer IL1 may be formed in different deposition conditions.

The first conductive layer is disposed on the base layer IL1. The first conductive layer may include a first sensing pattern SP1, a second sensing pattern SP2, and a second connecting pattern CP2 (refer to FIG. 7A). The second conductive layer is disposed on the first conductive layer. The second conductive layer may include a first connecting pattern CP1. The first insulating layer IL2 is disposed between the first conductive layer and the second conductive layer. The first insulating layer IL2 spaces and separates the first conductive layer and the second conductive layer in a cross-sectional view. The first insulating layer IL2 may have a contact hole for partially exposing the first sensing pattern SP1, and the first connecting pattern CP1 may be connected to the first sensing pattern SP1 through the contact hole. The second insulating layer IL3 is disposed on the first insulating layer IL2. The second insulating layer IL3 may cover the second conductive layer. The second insulating layer IL3 protects the second conductive layer from an external environment.

Mesh lines of the first sensing pattern SP1 and the second sensing pattern SP2 may define a plurality of mesh holes. The mesh lines may have a three-layer structure of titanium/aluminum/titanium.

In the display device DD according to an embodiment, the input sensor ISU may be directly disposed on the display panel DP. When the input sensor ISU is directly disposed on the display panel DP, an adhesive film is not disposed between the input sensor ISU and the display panel DP. For instance, the input sensor ISU may be formed on the display panel DP through a continuous process. In an embodiment, the display panel DP may be expressed as a display layer, and the input sensor ISU may be expressed as an input sensing layer.

The portions where the first electrodes AE and the emissive layers EML are disposed may be called pixel areas PXA. The pixel areas PXA may be disposed to be spaced apart from each other in the first direction DR1 and the second direction DR2 (refer to FIG. 1). A non-pixel area NPAX may be disposed between the pixel areas PXA and may surround the pixel areas PXA.

The anti-reflector RPP may be disposed on an upper surface of the input sensor ISU. In an embodiment, the anti-reflector RPP may include a polarizer film. The anti-reflector RPP may further include a protective film and a different functional film, in addition to the polarizer film. However, for convenience of description, only the polarizer film is illustrated. The adhesive member AD1 may be disposed between the anti-reflector RPP and the input sensor ISU. Accordingly, the anti-reflector RPP may be coupled with the input sensor ISU by the adhesive member AD1. The window WP may be coupled to the top of the anti-reflector RPP through the adhesive member AD2.

The display panel DP and the input sensor ISU will be described below in more detail.

Figure 6:
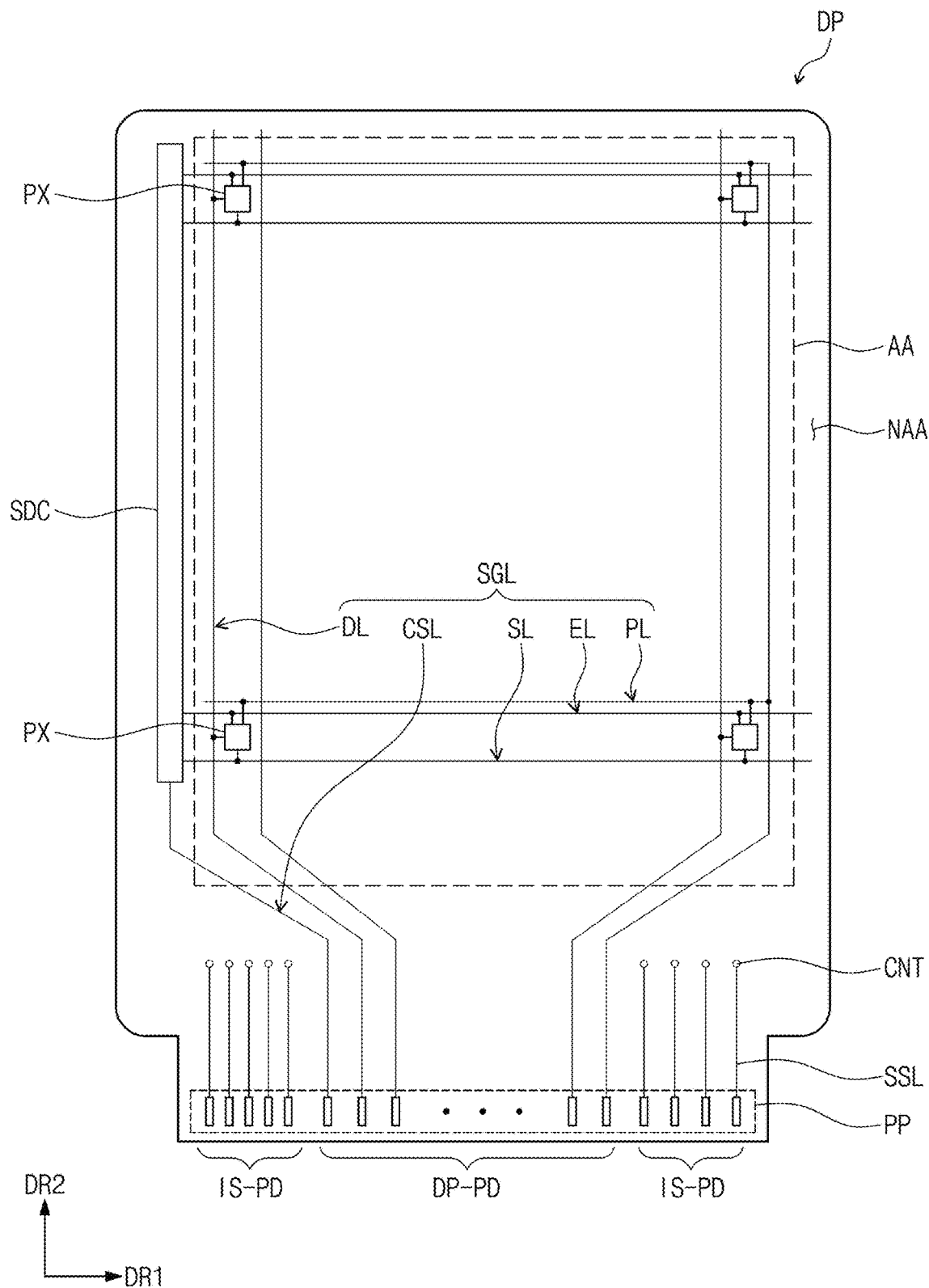
FIG. 6 is a plan view of the display panel of FIG. 4 according to an embodiment.

FIG. 6 is a plan view of the display panel DP according to an embodiment.

Referring to FIG. 6, the display panel DP may include a scan drive circuit SDC, a plurality of signal lines SGL (hereinafter, referred to as the signal lines), a plurality of signal pads DP-PD and IS-PD (hereinafter, referred to as the signal pads), and a plurality of pixels PX (hereinafter, referred to as the pixels).

The scan drive circuit SDC generates a plurality of scan signals (hereinafter, referred to as the scan signals) and outputs (e.g., sequentially outputs) the scan signals to a plurality of scan lines SL (hereinafter, referred to as the scan lines) to be described below. The scan drive circuit SDC may output other control signals as well as the scan signals to the pixels PX.

The scan drive circuit SDC may include a plurality of transistors formed through the same process(es) as transistors in the pixels PX.

The signal lines SGL include the scan lines SL, data lines DL, a power line PL, emission control lines EL, and a control signal line CSL. Each of the scan lines SL, the data lines DL, and the emission control lines EL is connected to a corresponding one of the pixels PX. The power line PL is commonly connected to the pixels PX. The control signal line CSL may provide control signals to the scan drive circuit SDC. The power line PL may provide a voltage for operation of the pixels PL. The power line PL may include a plurality of lines that provide different voltages.

In some embodiments, the signal lines SGL may further include auxiliary lines SSL. In an embodiment, the auxiliary lines SSL may be omitted. The auxiliary lines SSL are connected to contact holes CNT, respectively. The auxiliary lines SSL may be electrically connected with signal lines of the input sensor ISU (refer to FIG. 7), which will be described below, through the contact holes CNT.

The display panel DP may include the pad area PP. The plurality of signal pads DP-PD and IS-PD may be disposed in the pad area PP of the display panel DP. The signal pads DP-PD and IS-PD may include the first type signal pads DP-PD connected to the data lines DL, the power line PL, and the control signal line CSL, and the second type signal pads IS-PD may be connected to the auxiliary lines SSL. The first type signal pads DP-PD and the second type signal pads IS-PD are disposed adjacent to each other in the pad area PP defined in part of the peripheral area NAA. The stacking structures or constituent materials of the signal pads DP-PD and IS-PD may be formed through the same process(es) without a distinction therebetween.

The active area AA may be defined as an area where the pixels PX are disposed. A plurality of electronic elements is disposed in the active area AA. The electronic elements include organic light emitting diodes provided for the respective pixels PX and a pixel drive circuit connected to the organic light emitting diodes. The scan drive circuit SDC, the signal lines SGL, the signal pads DP-PD and IS-PD, and the pixel drive circuit may be included in the circuit element layer DP-CL illustrated in FIG. 4.

In some embodiments, each of the pixels PX may include a plurality of transistors, a capacitor, and an organic light emitting diode. The pixels PX emit light in response to signals received through the scan lines SL, the data lines DL, the emission control lines EL, and the power line PL.

The signal pads DP-PD and IS-PD of the display panel DP may be electrically connected with the printed circuit board FCB illustrated in FIG. 2.

A portion of the display panel DP illustrated in FIG. 6 may be bent. For instance, a portion of the peripheral area NAA of the display panel DP may be bent with respect to a bending axis parallel to the first direction DR1. The bending axis may be defined to overlap a part of the data lines DL and a part of the auxiliary lines SSL.

Figure 7A:
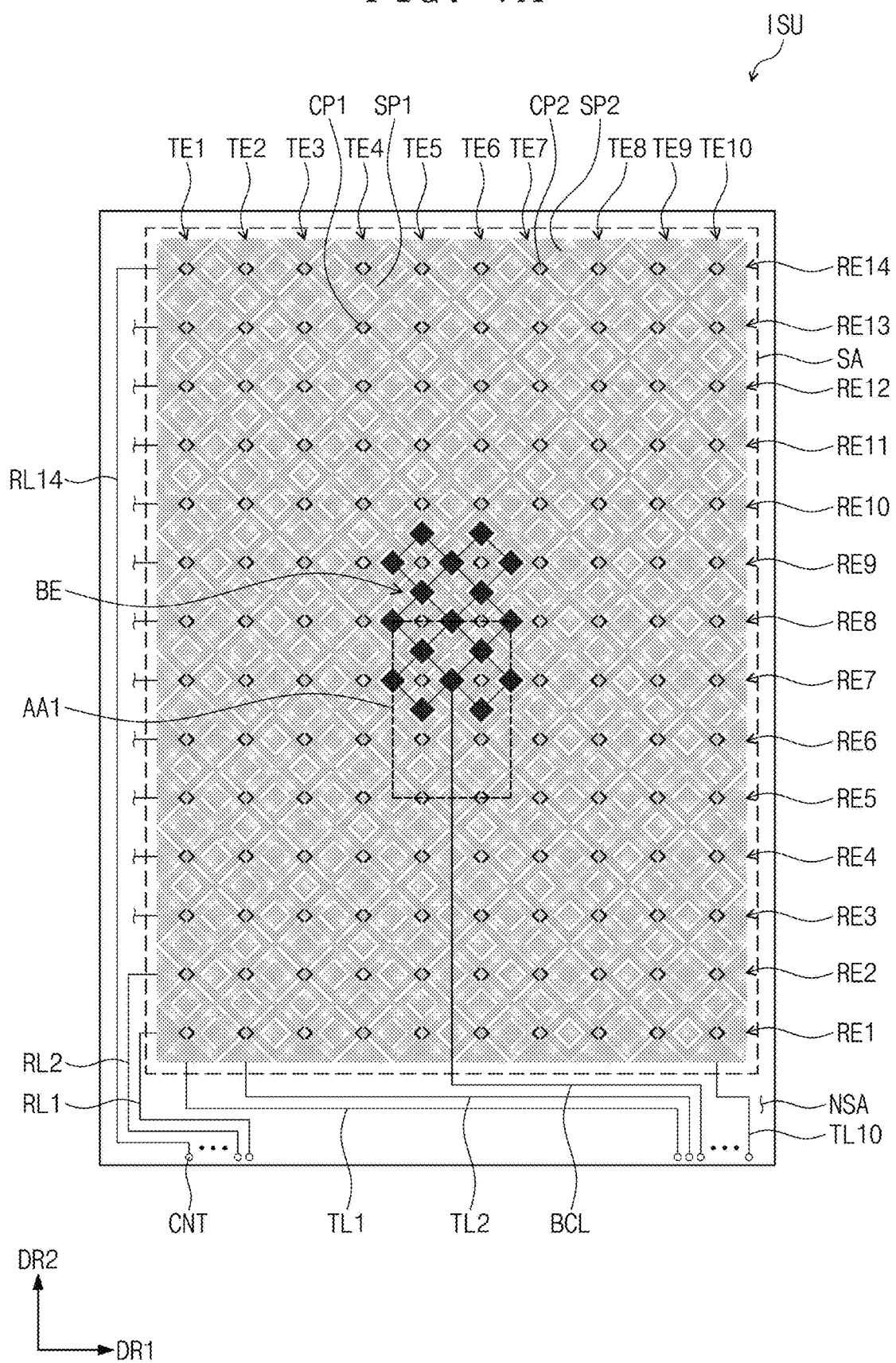
FIG. 7A is a plan view illustrating a configuration of an input sensor according to an embodiment.
Figure 7B:
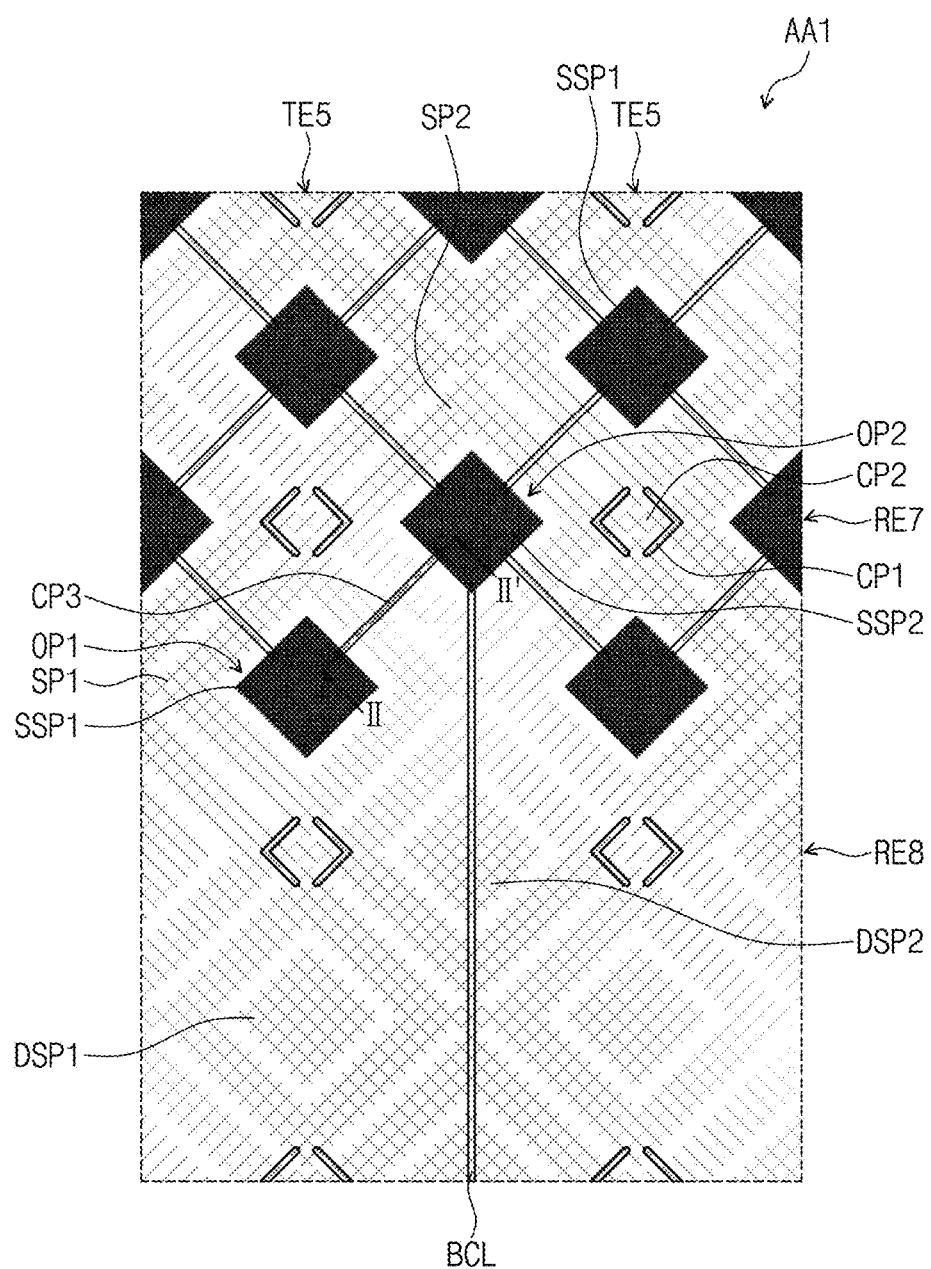
FIG. 7B is an enlarged view of an area AA1 illustrated in FIG. 7A according to an embodiment.

FIG. 7A is a plan view illustrating a configuration of the input sensor ISU according to an embodiment. FIG. 7B is an enlarged view of area AA1 illustrated in FIG. 7A according to an embodiment.

Referring to FIGS. 7A and 7B, the input sensor ISU may include a sensing area SA and a non-sensing area NSA. The sensing area SA may be an area activated depending on an electrical signal. For example, the sensing area SA may be an area that senses an input. The non-sensing area NSA may surround the sensing area SA. The sensing area SA may correspond to the active area AA of the display panel DP illustrated in FIG. 6, and the non-sensing area NSA may correspond to the peripheral area NAA of the display panel DP illustrated in FIG. 6.

The input sensor ISU includes transmitting electrodes TE1 to TE10 and receiving electrodes RE1 to RE14. The transmitting electrodes TE1 to TE10 and the receiving electrodes RE1 to RE14 are disposed in the sensing area SA. In the sensing area SA, the transmitting electrodes TE1 to TE10 and the receiving electrodes RE1 to RE14 are electrically insulated from each other and intersect each other. In an embodiment, the input sensor ISU includes the first to tenth transmitting electrodes TE1 to TE10 and the first to fourteenth receiving electrodes RE1 to RE14. However, embodiments are not limited thereto. The number of transmitting electrodes and the number of receiving electrodes may be diversely changed. FIG. 7A illustrates an example that the number of receiving electrodes is larger than the number of transmitting electrodes. However, in an embodiment, the number of transmitting electrodes may be larger than or equal to the number of receiving electrodes.

To clearly distinguish between the electrodes TE1 to TE10 and the electrodes RE1 to RE14, the electrodes TE1 to TE10 are called transmitting electrodes and the electrodes RE1 to RE14 are called receiving electrodes. However, the functions of the electrodes are not limited by the names thereof. Depending on operating modes, the transmitting electrodes TE1 to TE10 may operate as receiving electrodes as well as transmitting electrodes, and the receiving electrodes RE1 to RE14 may operate as transmitting electrodes as well as receiving electrodes. In an embodiment, the electrodes TE1 to TE10 may be expressed as first electrodes, and the electrodes RE1 to RE14 may be expressed as second electrodes.

Each of the first to tenth transmitting electrodes TE1 to TE10 extends in the second direction DR2. The first to tenth transmitting electrodes TE1 to TE10 may be arranged to be spaced apart from each other in the first direction DR1. The first to tenth transmitting electrodes TE1 to TE10 may be electrically separated from each other. Each of the first to tenth transmitting electrodes TE1 to TE10 includes first sensing patterns SP1 spaced apart from each other in the second direction DR2 and first connecting patterns CP1 electrically connecting the first sensing patterns SP1. The first sensing patterns SP1 and the first connecting patterns CP1 are disposed on different layers and do not have an integrated shape, but embodiments are not limited thereto.

Each of the first to fourteenth receiving electrodes RE1 to RE14 extends in the first direction DR1. The first to fourteenth receiving electrodes RE1 to RE14 may be arranged to be spaced apart from each other in the second direction DR2. The first to fourteenth receiving electrodes RE1 to RE14 may be electrically separated from each other. The first to fourteenth receiving electrodes RE1 to RE14 may be disposed to intersect the first to tenth transmitting electrodes TE1 to TE10 and may be electrically insulated from the first to tenth transmitting electrodes TE1 to TE10. Each of the first to fourteenth receiving electrodes RE1 to RE14 includes second sensing patterns SP2 spaced apart from each other in the first direction DR1 and second connecting patterns CP2 electrically connecting the second sensing patterns SP2. The second sensing patterns SP2 and the second connecting patterns CP2 may have an integrated shape, but embodiments are not limited thereto.

In FIGS. 7A and 7B, the first sensing patterns SP1 and the second sensing patterns SP2 having a rhombic shape are illustrated as an example. However, embodiments are not limited thereto. The first sensing patterns SP1 and the second sensing patterns SP2 may have different polygonal shapes.

The first to tenth transmitting electrodes TE1 to TE10 and the first to fourteenth receiving electrodes RE1 to RE14 may each have a mesh shape. As each of the first to tenth transmitting electrodes TE1 to TE10 and the first to fourteenth receiving electrodes RE1 to RE14 has a mesh shape, parasitic capacitance with the electrodes (e.g., the second electrode CE (refer to FIG. 5)) of the display panel DP (refer to FIG. 6) may be decreased.

The input sensor ISU may obtain position information for an external input through a change in mutual capacitance between the first to tenth transmitting electrodes TE1 to TE10 and the first to fourteenth receiving electrodes RE1 to RE14.

The input sensor ISU may further include first to tenth transmitting lines TL1 to TL10 and first to fourteenth receiving lines RL1 to RL14. The first to tenth transmitting lines TL1 to TL10 and the first to fourteenth receiving lines RL1 to RL14 may be disposed in the non-sensing area NSA. Each of the first to tenth transmitting lines TL1 to TL10 is electrically connected to one side of a corresponding one of the first to tenth transmitting electrodes TE1 to TE10, and each of the first to fourteenth receiving lines RL1 to RL14 is electrically connected to one side of a corresponding one of the first to fourteenth receiving electrodes RE1 to RE14. However, embodiments are not limited thereto. For instance, in an embodiment, the input sensor ISU may further include transmitting lines, each of which is electrically connected to an opposite side of a corresponding one of the first to tenth transmitting electrodes TE1 to TE10.

The input sensor ISU is electrically connected with the readout circuit ROC (refer to FIG. 2) through the first to tenth transmitting lines TL1 to TL10 and the first to fourteenth receiving lines RL1 to RL14. The readout circuit ROC may control operation of the input sensor ISU.

The readout circuit ROC may transmit transmission signals to the first to tenth transmitting lines TL1 to TL10 and/or the first to fourteenth receiving lines RL1 to RL14, and may receive reception signals from the first to tenth transmitting lines TL1 to TL10 and/or the first to fourteenth receiving lines RL1 to RL14. Operations of the readout circuit ROC and the input sensor ISU will be described below in more detail.

The input sensor ISU may be a capacitive touch sensor. For example, one of the first to tenth transmitting electrodes TE1 to TE10 and the first to fourteenth receiving electrodes RE1 to RE14 receive transmission signals, and the other of the first to tenth transmitting electrodes TE1 to TE10 and the first to fourteenth receiving electrodes RE1 to RE14 output a change in capacitance between the first to tenth transmitting electrodes TE1 to TE10 and the first to fourteenth receiving electrodes RE1 to RE14 as a sensing signal. For example, when the first transmitting electrode TE1 receives a transmission signal (or a driving signal), the first transmitting electrode TE1 is capacitively coupled to the first to fourteenth receiving electrodes RE1 to RE14. When a part of the user's body is located on a specific receiving electrode (e.g., the first receiving electrode RE1) among the capacitively coupled first to fourteenth receiving electrodes RE1 to RE14, the capacitance between the first transmitting electrode TE1 and the first receiving electrode RE1 is changed. The readout circuit ROC (refer to FIG. 2) may determine (e.g., calculate) coordinate information of the position of the user's touch by detecting changed capacitance of a sensing signal received from the first receiving line RL1 connected with the first receiving electrode RE1.

In an embodiment, first openings OP1 may be defined in the first sensing patterns SP1, respectively, and second openings OP2 may be defined in the second sensing patterns SP2, respectively.

The input sensor ISU may further include a body composition sensing electrode BE. In an embodiment, the body composition sensing electrode BE may be expressed as a third electrode. The body composition sensing electrode BE may include first sub-sensing patterns SSP1, second sub-sensing patterns SSP2, third connecting patterns CP3, and a body composition sensing line BCL.

The body composition sensing electrode BE may be electrically connected to the readout circuit ROC (refer to FIG. 2) through the body composition sensing line BCL. The readout circuit ROC may output a body composition signal to the body composition sensing electrode BE through the body composition sensing line BCL and may receive a body composition signal from the body composition sensing line BCL.

The first sub-sensing patterns SSP1 may be disposed in the first opening OP1 of corresponding first sensing patterns among the first sensing patterns SP1. The second sub-sensing patterns SSP2 may be disposed in the second opening OP2 of corresponding second sensing patterns among the second sensing patterns SP2.

The first sub-sensing patterns SSP1 and the second sub-sensing patterns SSP2 are insulated from the first sensing patterns SP1 and the second sensing patterns SP2.

In FIGS. 7A and 7B, the first sub-sensing patterns SSP1 and the second sub-sensing patterns SSP2 having a rhombic shape are illustrated as an example. However, embodiments are not limited thereto. The first sub-sensing patterns SSP1 and the second sub-sensing patterns SSP2 may have different polygonal shapes. The first sub-sensing patterns SSP1 and the second sub-sensing patterns SSP2 may each have a mesh shape.

The third connecting patterns CP3 electrically connect the first sub-sensing patterns SSP1 and the second sub-sensing patterns SSP2.

First dummy patterns DSP1 may be disposed in the first openings OP1 of first sensing patterns not corresponding to the first sub-sensing patterns SSP1 among the first sensing patterns SP1. Second dummy patterns DSP2 may be disposed in the second openings OP2 of second sensing patterns not corresponding to the second sub-sensing patterns SSP2 among the second sensing patterns SP2. The first dummy patterns DSP1 and the second dummy patterns DSP2 may be in a floating state.

In an embodiment, the number of first sub-sensing patterns SSP1 may be smaller than the number of first sensing patterns SP1. In an embodiment, the number of second sub-sensing patterns SSP2 may be smaller than the number of second sensing patterns SP2. Furthermore, the sum of the first sub-sensing patterns SSP1 and the second sub-sensing patterns SSP2 may be smaller than the sum of the first sensing patterns SP1 and the second sensing patterns SP2.

Figure 8:
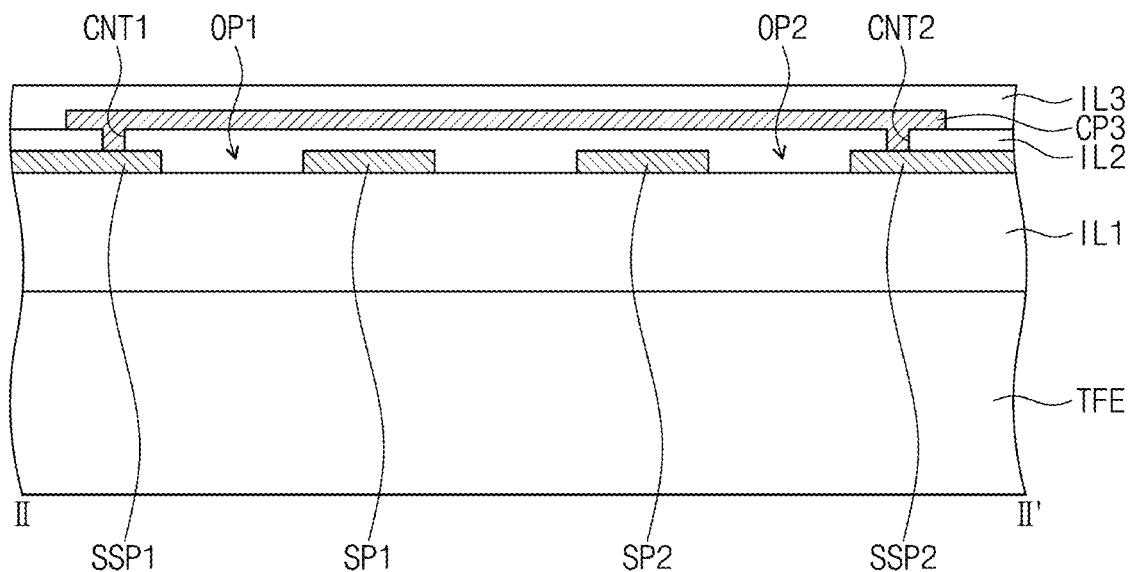
FIG. 8 is a sectional view taken along sectional line II-II' illustrated in FIG. 7B according to an embodiment.

FIG. 8 is a sectional view taken along sectional line II-IF illustrated in FIG. 7B according to an embodiment.

Referring to FIG. 8, the first sensing pattern SP1, the second sensing pattern SP2, the first sub-sensing pattern SSP1, and the second sub-sensing pattern SSP2 may be formed by the first conductive layer disposed on the base layer IL1.

The first sensing pattern SP1 and the first sub-sensing pattern SSP1 may be spaced apart from each other with the first opening OP1 therebetween. The second sensing pattern SP2 and the second sub-sensing pattern SSP2 may be spaced apart from each other with the second opening OP2 therebetween.

The third connecting pattern CP3 may be formed by the second conductive layer disposed on the first insulating layer IL2.

The third connecting pattern CP3 may be electrically connected with the first sub-sensing pattern SSP1 through a first contact hole CNT1 formed through the first insulating layer IL2. The third connecting pattern CP3 may be electrically connected with the second sub-sensing pattern SSP2 through a second contact hole CNT2 formed through the first insulating layer IL2. Accordingly, the first sub-sensing pattern SSP1 may be electrically connected with the second sub-sensing pattern SSP2 through the third connecting pattern CP3.

In an embodiment, the body composition sensing line BCL illustrated in FIGS. 7A and 7B may be formed by the same second conductive layer as the third connecting patterns CP3. However, embodiments are not limited thereto. For instance, in an embodiment, the body composition sensing line BCL may be formed by a third conductive layer that is different from the first conductive layer and the second conductive layer.

Figure 9:
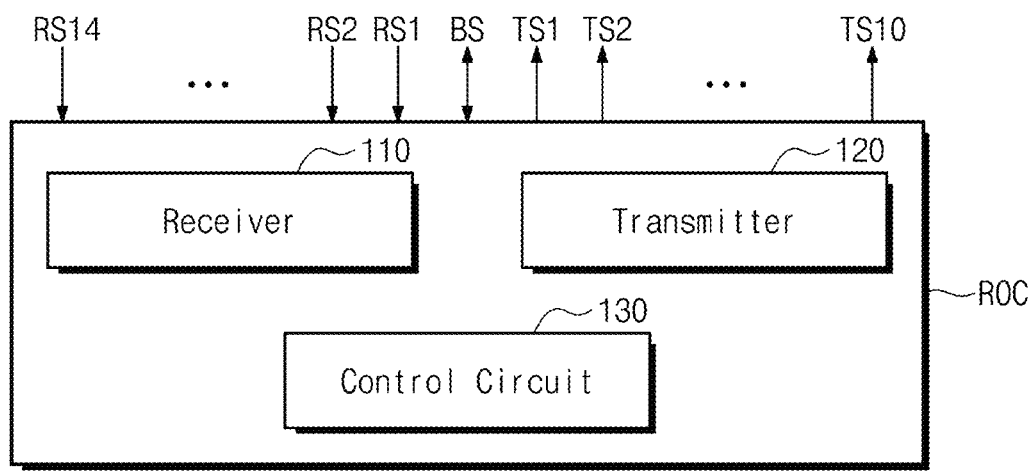
FIG. 9 is a block diagram of a readout circuit according to an embodiment.

FIG. 9 is a block diagram of the readout circuit according to an embodiment.

Referring to FIG. 9, the readout circuit ROC includes a receiver 110, a transmitter 120, and a control circuit 130.

The receiver 110 receives first to fourteenth reception signals RS1 to RS14 from the first to fourteenth receiving electrodes RE1 to RE14. The first to fourteenth reception signals RS1 to RS14 received from the first to fourteenth receiving electrodes RE1 to RE14 may be analog capacitance signals by the user's input TC (refer to FIG. 1). The receiver 110 may include an analog front end (AFE) circuit for sensing the analog capacitance signals.

The transmitter 120 transmits first to tenth transmission signals TS1 to TS10 to the first to tenth transmitting electrodes TE1 to TE10 in response to control from the control circuit 130.

In an embodiment, the receiver 110 receives a body composition signal BS from the body composition sensing electrode BE through the body composition sensing line BCL, and the transmitter 120 outputs the body composition signal BS to the body composition sensing electrode BE through the body composition sensing line BCL.

The readout circuit ROC may control the first to tenth transmission signals TS1 to TS10, the first to fourteenth reception signals RS1 to RS14, and the body composition signal BS depending on operating modes.

Figure 10A:
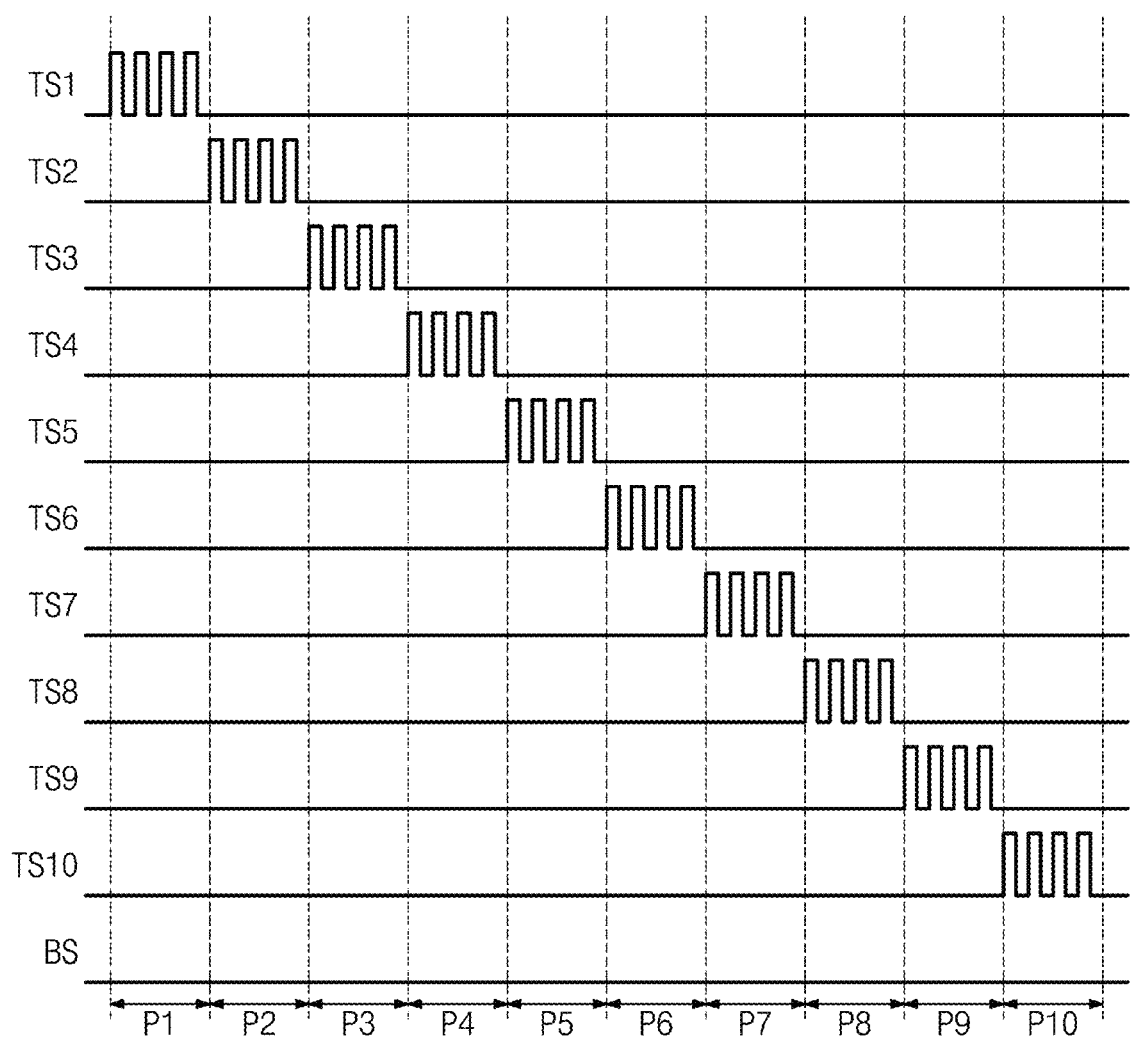
FIG. 10A is a timing chart illustrating first to tenth transmission signals provided to first to tenth transmitting lines and a body composition signal provided to a body composition sensing line of the input sensor illustrated in FIG. 7A during a normal mode according to an embodiment.

FIG. 10A is a timing chart illustrating first to tenth transmission signals TS1 to TS10 provided to the first to tenth transmitting lines TL1 to TL10 and a body composition signal BS provided to the body composition sensing line BCL of the input sensor ISU illustrated in FIG. 7A during a normal mode according to an embodiment.

Figure 10B:
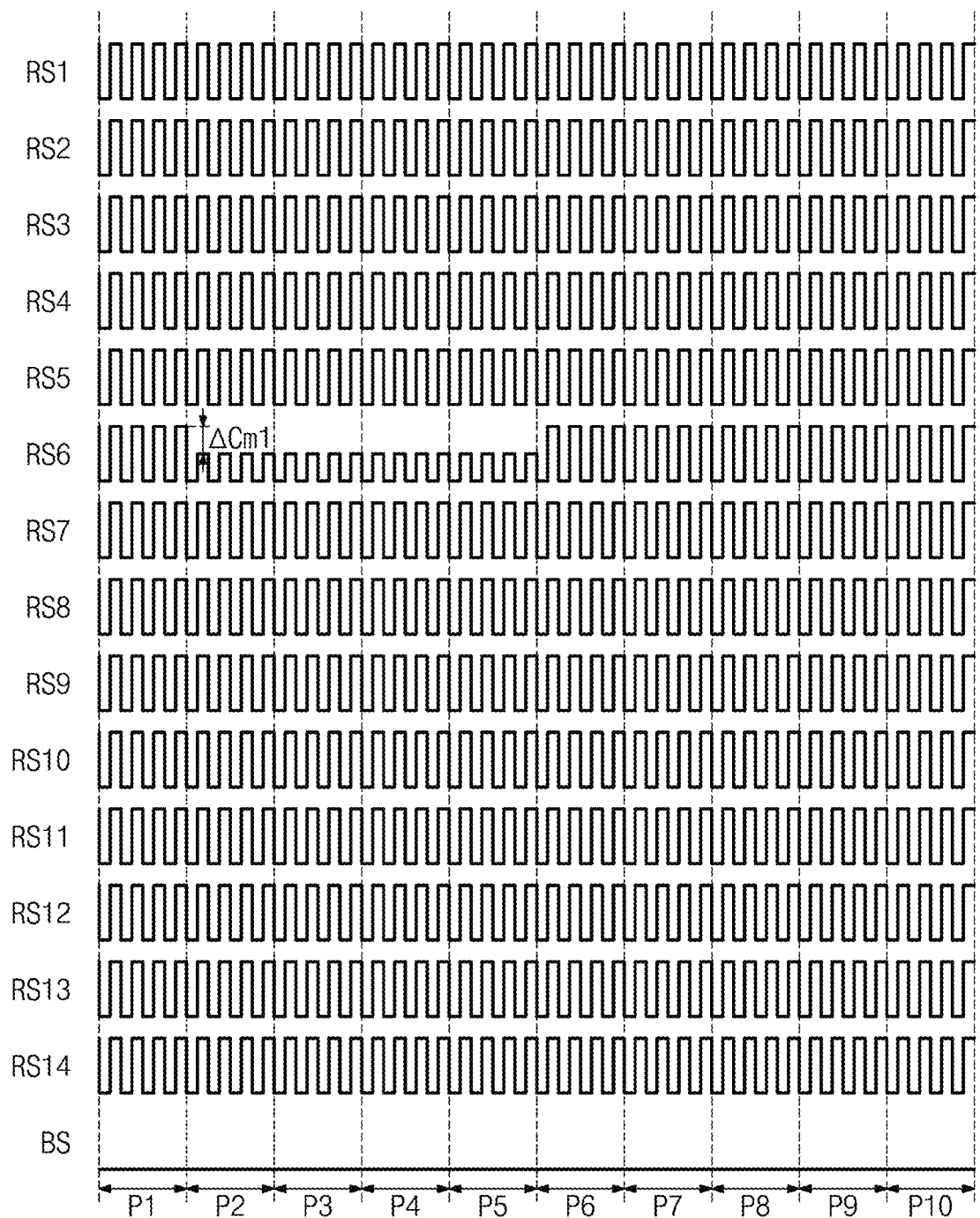
FIG. 10B is a timing chart illustrating reception signals received from first to fourteenth receiving lines and a body composition signal received through the body composition sensing line of the input sensor illustrated in FIG. 7A during the normal mode according to an embodiment.

FIG. 10B is a timing chart illustrating reception signals RS1 to RS14 received from the first to fourteenth receiving lines RL1 to RL14 and a body composition signal BS received through the body composition sensing line BCL of the input sensor ISU illustrated in FIG. 7A during the normal mode according to an embodiment.

Referring to FIGS. 7A, 9, 10A, and 10B, during the normal mode, the readout circuit ROC may perform input sensing on the entire area of the input sensor ISU. In the normal mode, the control circuit 130 outputs the first to tenth transmission signals TS1 to TS10 to the first to tenth transmitting electrodes TE1 to TE10 through the transmitter 120 and receives the first to fourteenth reception signals RS1 to RS14 from the first to fourteenth receiving electrodes RE1 to RE14 through the receiver 110. The first to tenth transmission signals TS1 to TS10 may sequentially transition to an active level in first to tenth intervals P1 to P10. For example, the first transmission signal TS1 may be a pulse signal that periodically swings between a high level and a low level during the first interval P1, and the second transmission signal TS2 may be a pulse signal that periodically swings between a high level and a low level during the second interval P2.

In an embodiment, during the normal mode, the body composition signal BS may be at an inactive level (e.g., a low level). In an embodiment, during the normal mode, the body composition signal BS may be in a floating state. For instance, in the normal mode, the readout circuit ROC may maintain the body composition signal BS at the inactive level or in the floating state.

When the sequentially activated first to tenth transmission signals TS1 to TS10 are provided to the first to tenth transmitting electrodes TE1 to TE10, the voltages (or currents) of the first to fourteenth receiving electrodes RE1 to RE14 may vary depending on the capacitances between the first to tenth transmitting electrodes TE1 to TE10 and the first to fourteenth receiving electrodes RE1 to RE14. The readout circuit ROC may recognize the position of the user's input TC through voltage (or current) variations $\Delta Cm1$ of the first to fourteenth reception signals RS1 to RS14 in the first to tenth intervals P1 to P10.

Figure 11A:
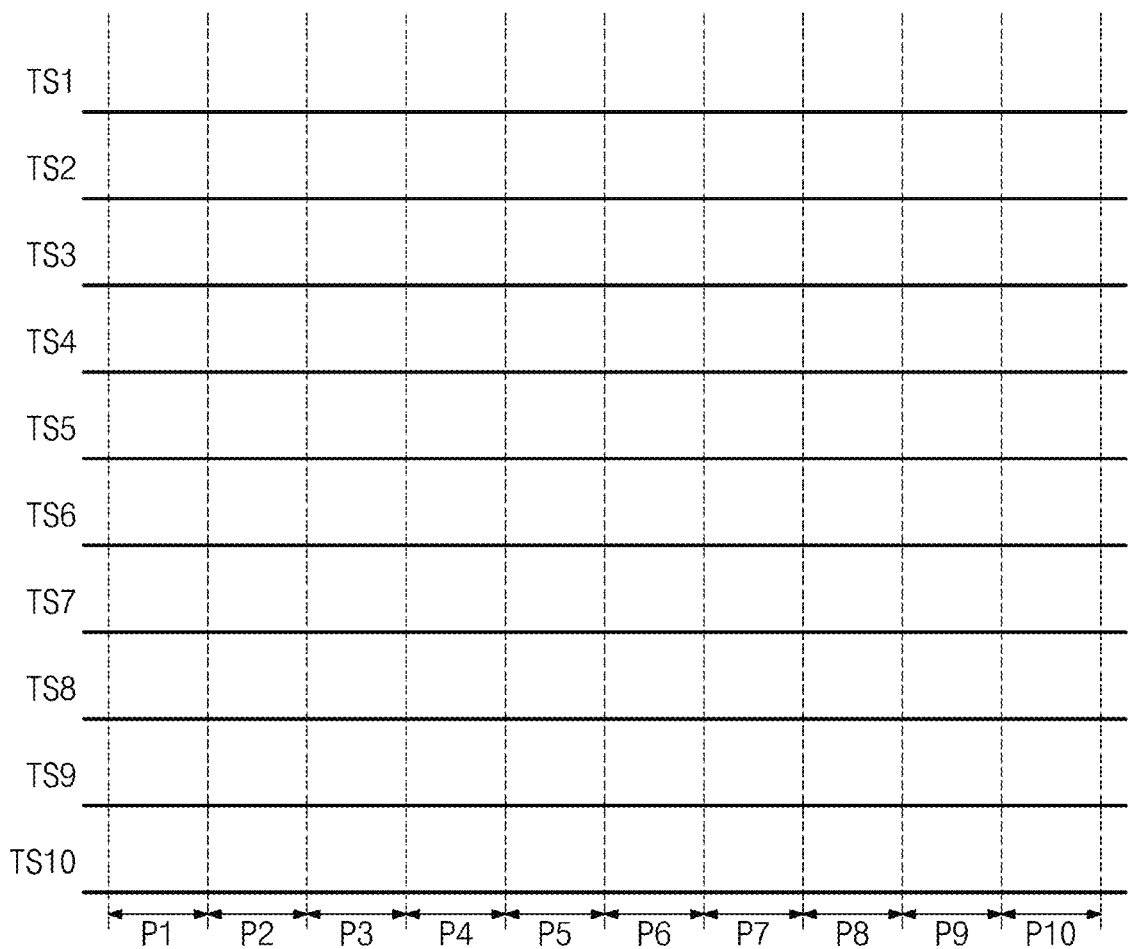
FIG. 11A is a timing chart illustrating first to tenth transmission signals provided to the first to tenth transmitting lines of the input sensor illustrated in FIG. 7A during a body composition measurement mode according to an embodiment.

FIG. 11A is a timing chart illustrating first to tenth transmission signals TS1 to TS10 provided to the first to tenth transmitting lines TL1 to TL10 of the input sensor ISU illustrated in FIG. 7A during a body composition measurement mode according to an embodiment.

Figure 11B:
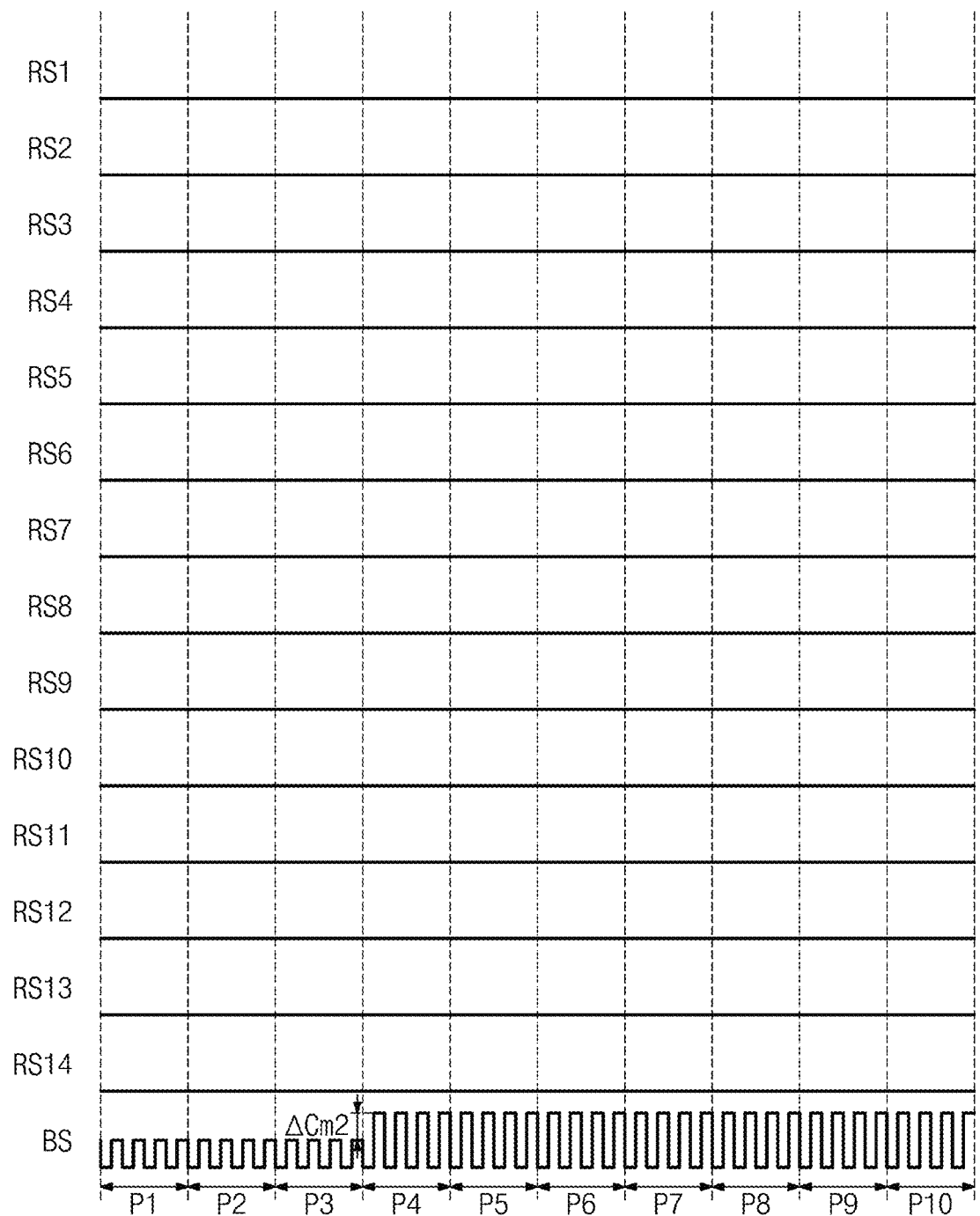
FIG. 11B is a timing chart illustrating reception signals received from the first to fourteenth receiving lines and a body composition signal received through the body composition sensing line of the input sensor illustrated in FIG. 7A during the body composition measurement mode according to an embodiment.

FIG. 11B is a timing chart illustrating reception signals RS1 to RS14 received from the first to fourteenth receiving lines RL1 to RL14 and a body composition signal BS received through the body composition sensing line BCL of the input sensor ISU illustrated in FIG. 7A during the body composition measurement mode according to an embodiment.

Referring to FIGS. 7A, 9, 11A, and 11B, during the body composition measurement mode, the first to tenth transmission signals TS1 to TS10 and the first to fourteenth reception signals RS1 to RS14 may be maintained at an inactive level (e.g., a low level) or in a floating state.

During the body composition measurement mode, the control circuit 130 in the readout circuit ROC outputs the body composition signal BS through the transmitter 120 and receives the body composition signal BS through the receiver 110.

The control circuit 130 is able to measure and analyze the user's body composition through a variation $\Delta Cm2$ in the body composition signal BS received through the receiver 110.

The body composition sensing electrode BE may be a sensing electrode for sensing the user's body composition. In an embodiment, the body composition may include a muscle mass, a body fat mass, a moisture level, a heart rate, blood pressure, skin elasticity, and/or the like.

The readout circuit ROC may provide, to the body composition sensing electrode BE, the body composition signal BS in a pulse form that swings within a predetermined range and may sense the variation $\Delta Cm2$ in the body composition signal BS. The method (e.g., a self-capacitance method) of sensing the variation $\Delta Cm2$ in the body composition signal BS through the one body composition sensing line BCL as described above may accurately measure a variation in capacitance. Accordingly, the reliability of a measurement result on the user's body composition may be improved.

Figure 12A:
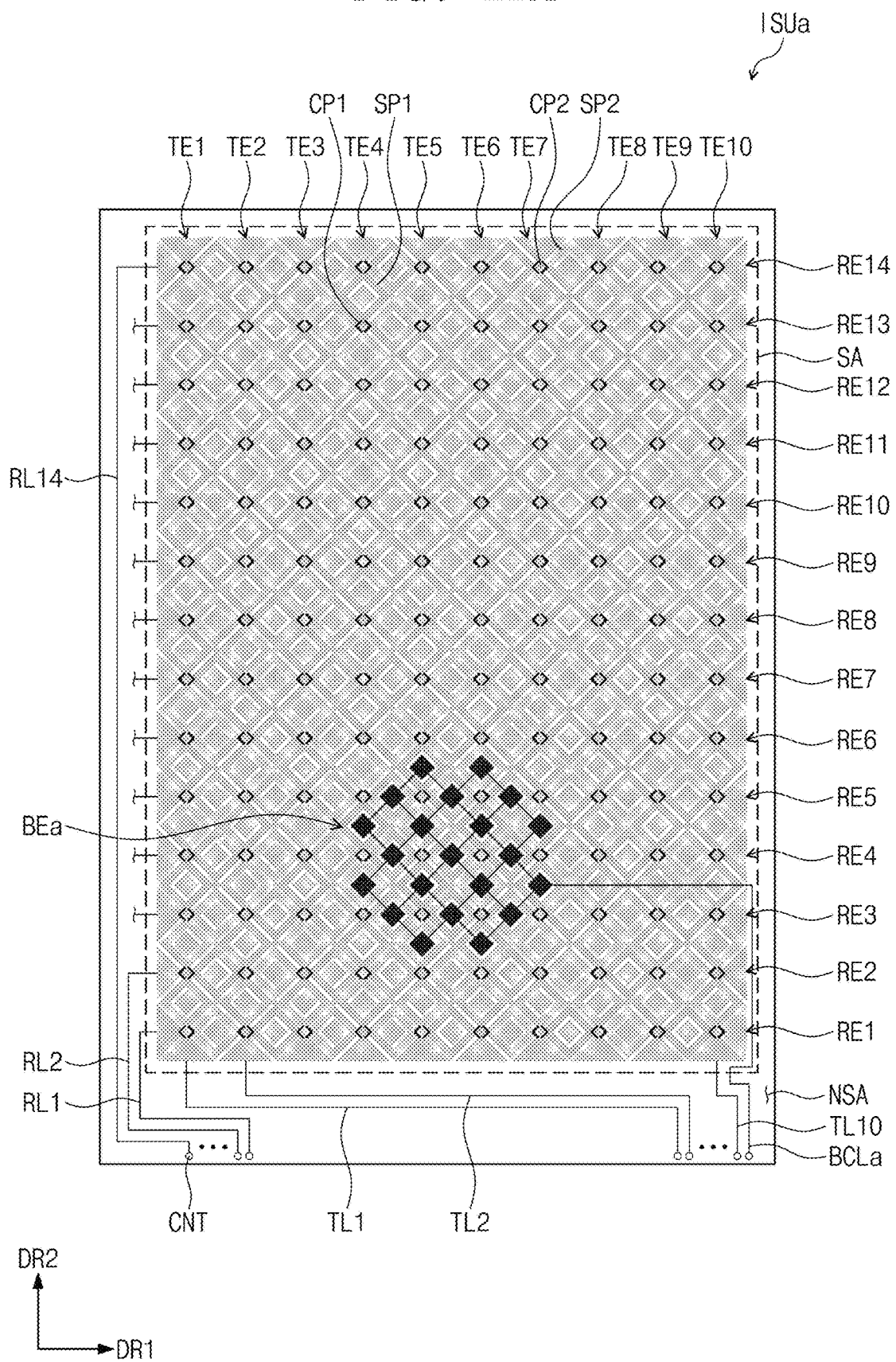
FIGS. 12A and 12B are plan views illustrating configurations of input sensors according to various embodiments.
Figure 12B:
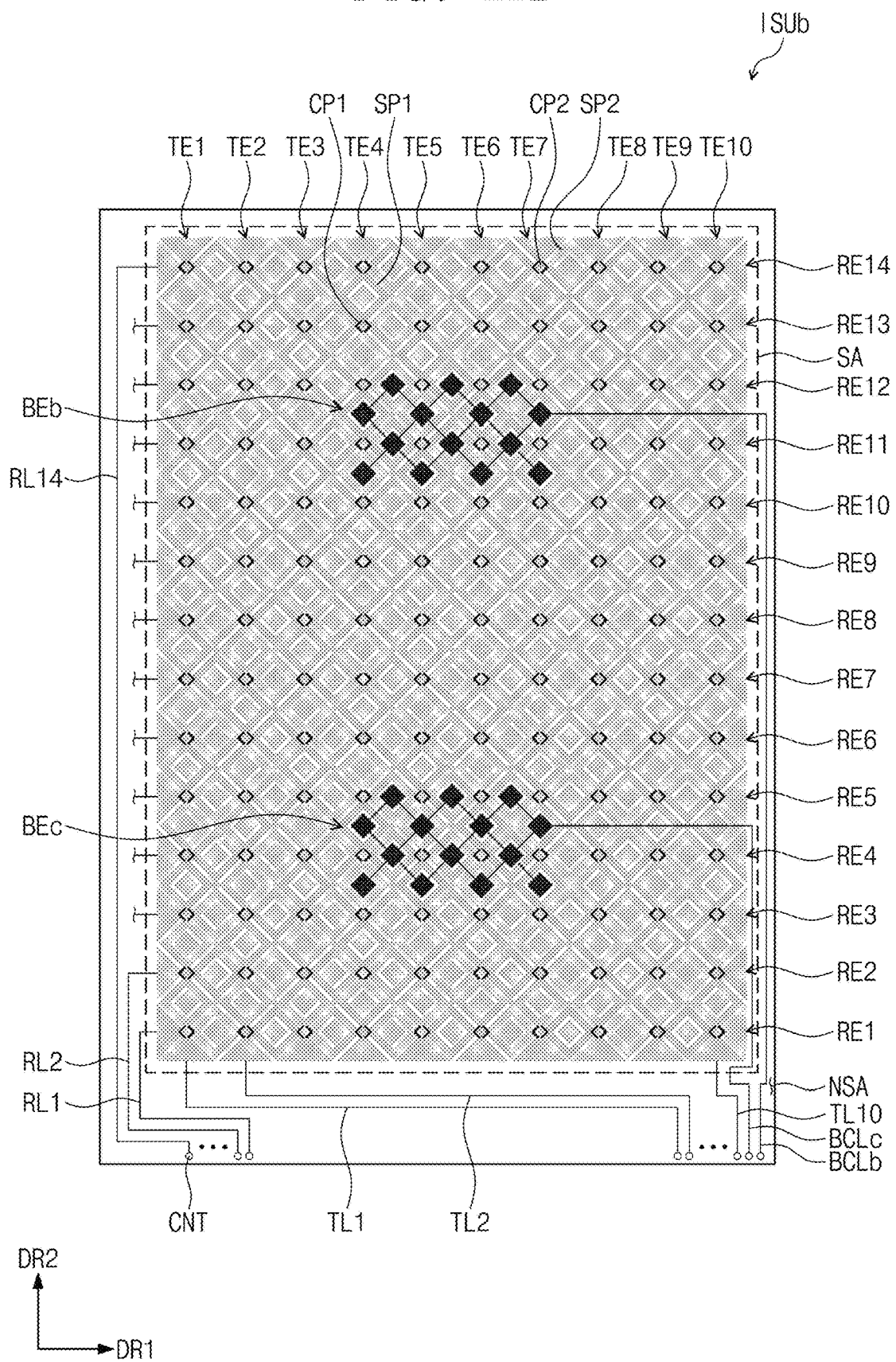

FIGS. 12A and 12B are plan views illustrating configurations of input sensors ISUa and ISUb according to various embodiments.

The input sensor ISUa illustrated in FIG. 12A includes a body composition sensing electrode BEa and a body composition sensing line BCLa.

The input sensor ISUb illustrated in FIG. 12B includes body composition sensing electrodes BEb and BEc and body composition sensing lines BCLb and BCLc.

As illustrated in FIGS. 7A, 12A, and 12B, the sizes, numbers, and shapes of the body composition sensing electrodes BE, BEa, BEb, and BEc may be diversely changed.

The body composition sensing line BCL illustrated in FIG. 7A extends in the second direction DR2 and is electrically connected with the body composition sensing electrode BE, whereas the body composition sensing line BCLa illustrated in FIG. 12A extends in the first direction DR1 and is electrically connected with the body composition sensing electrode BEa.

As described above, the forms in which the body composition sensing lines BCL, BCLa, BCLb, and BCLc are connected to the body composition sensing electrodes BE, BEa, BEb, and BEc may be diversely changed.

Figure 13A:
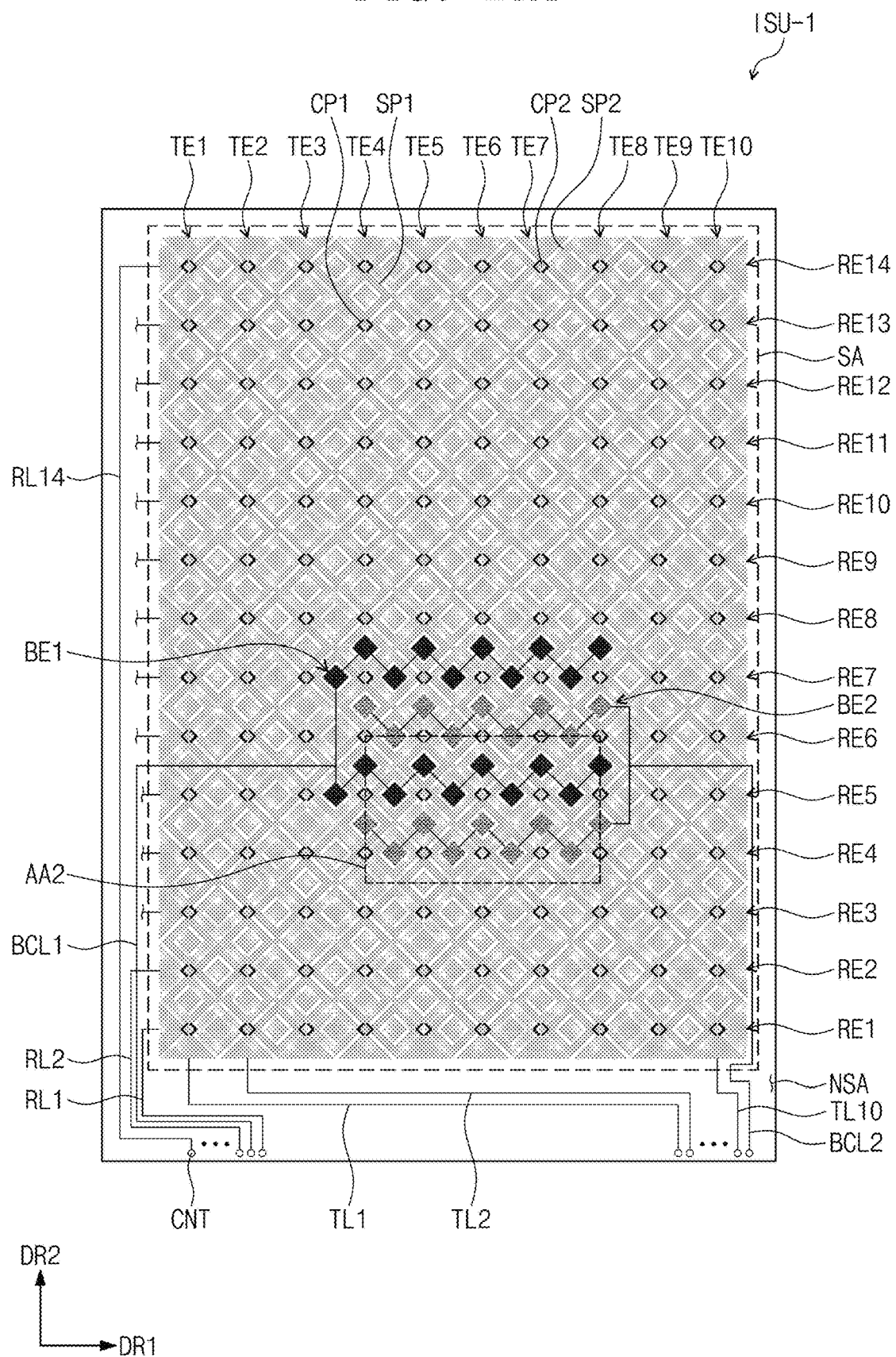
FIG. 13A is a plan view illustrating a configuration of an input sensor according to an embodiment.
Figure 13B:
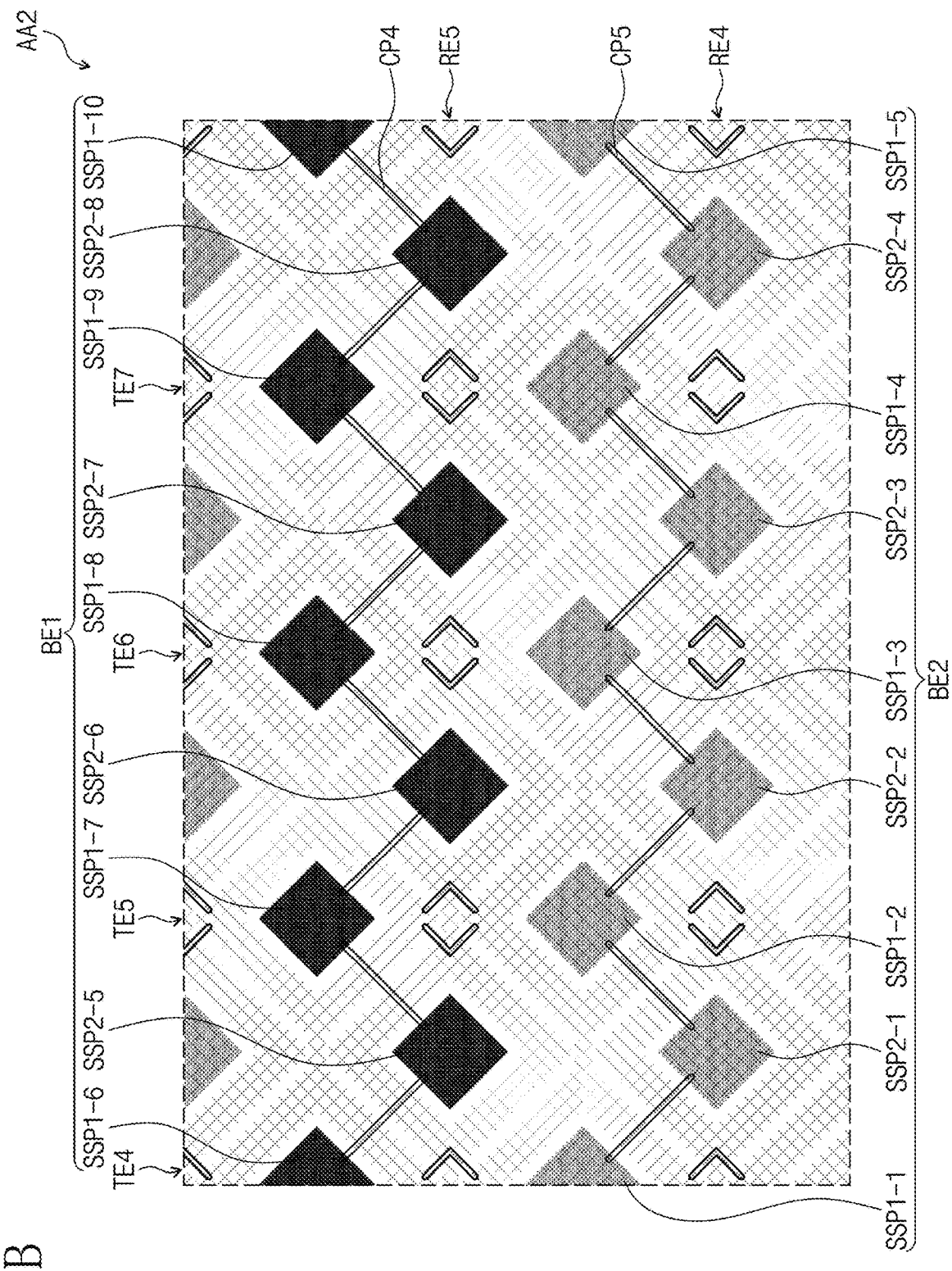
FIG. 13B is an enlarged view of an area AA2 illustrated in FIG. 13A according to an embodiment.

FIG. 13A is a plan view illustrating a configuration of an input sensor ISU-1 according to an embodiment. FIG. 13B is an enlarged view of area AA2 illustrated in FIG. 13A according to an embodiment.

Referring to FIGS. 13A and 13B, the input sensor ISU-1 includes transmitting electrodes TE1 to TE10, receiving electrodes RE1 to RE14, first to tenth transmitting lines TL1 TL10, and first to fourteenth receiving lines RL1 to RL14. The transmitting electrodes TE1 to TE10, the receiving electrodes RE1 to RE14, the first to tenth transmitting lines TL1 to TL10, and the first to fourteenth receiving lines RL1 to RL14 illustrated in FIGS. 13A and 13B are identical to the transmitting electrodes TE1 to TE10, the receiving electrodes RE1 to RE14, the first to tenth transmitting lines TL1 to TL10, and the first to fourteenth receiving lines RL1 to RL14 illustrated in FIGS. 7A and 7B, and therefore, will be assigned with identical reference numerals, and repetitive descriptions will be omitted.

The input sensor ISU-1 may further include a first body composition sensing electrode BE1 and a second body composition sensing electrode BE2. In an embodiment, the first body composition sensing electrode BE1 may be expressed as a third electrode, and the second body composition sensing electrode BE2 may be expressed as a fourth electrode. The first body composition sensing electrode BE1 may include first sub-sensing patterns SSP1-6, SSP1-7, SSP1-8, SSP1-9, and SSP1-10, second sub-sensing patterns SSP2-5, SSP2-6, SSP2-7, and SSP2-8, connecting patterns CP4, and a first body composition sensing line BCL1.

The connecting patterns CP4 electrically connect the first sub-sensing patterns SSP1-6, SSP1-7, SSP1-8, SSP1-9, and SSP1-10 and the second sub-sensing patterns SSP2-5, SSP2-6, SSP2-7, and SSP2-8.

The first body composition sensing electrode BE1 may be electrically connected with a readout circuit ROC-1 through the first body composition sensing line BCL1. The readout circuit ROC-1 may output a body composition signal to the first body composition sensing electrode BE1 through the first body composition sensing line BCL1.

The first sub-sensing patterns SSP1-6, SSP1-7, SSP1-8, SSP1-9, and SSP1-10 may be disposed in first openings OP1 of corresponding first sensing patterns among first sensing patterns SP1. The second sub-sensing patterns SSP2-5, SSP2-6, SSP2-7, and SSP2-8 may be disposed in second openings OP2 of corresponding second sensing patterns among second sensing patterns SP2.

The first sub-sensing patterns SSP1-6, SSP1-7, SSP1-8, SSP1-9, and SSP1-10 and the second sub-sensing patterns SSP2-5, SSP2-6, SSP2-7, and SSP2-8 are insulated from the first sensing patterns SP1 and the second sensing patterns SP2.

The second body composition sensing electrode BE2 may include third sub-sensing patterns SSP1-1, SSP1-2, SSP1-3, SSP1-4, and SSP1-5, fourth sub-sensing patterns SSP2-1, SSP2-2, SSP2-3, and SSP2-4, connecting patterns CP5, and a second body composition sensing line BCL2.

The connecting patterns CP5 electrically connect the third sub-sensing patterns SSP1-1, SSP1-2, SSP1-3, SSP1-4, and SSP1-5 and the fourth sub-sensing patterns SSP2-1, SSP2-2, SSP2-3, and SSP2-4.

The second body composition sensing electrode BE2 may be electrically connected with the readout circuit ROC-1 through the second body composition sensing line BCL2. The readout circuit ROC-1 may receive a body composition signal from the second body composition sensing electrode BE2 through the second body composition sensing line BCL2.

The third sub-sensing patterns SSP1-1, SSP1-2, SSP1-3, SSP1-4, and SSP1-5 may be disposed in first openings OP1 of corresponding first sensing patterns among the first sensing patterns SP1. The fourth sub-sensing patterns SSP2-1, SSP2-2, SSP2-3, and SSP2-4 may be disposed in second openings OP2 of corresponding second sensing patterns among the second sensing patterns SP2.

The third sub-sensing patterns SSP1-1, SSP1-2, SSP1-3, SSP1-4, and SSP1-5 and the fourth sub-sensing patterns SSP2-1, SSP2-2, SSP2-3, and SSP2-4 are insulated from the first sensing patterns SP1 and the second sensing patterns SP2.

In FIGS. 13A and 13B, the first sub-sensing patterns SSP1-6, SSP1-7, SSP1-8, SSP1-9, and SSP1-10, the second sub-sensing patterns SSP2-5, SSP2-6, SSP2-7, and SSP2-8, the third sub-sensing patterns SSP1-1, SSP1-2, SSP1-3, SSP1-4, and SSP1-5, and the fourth sub-sensing patterns SSP2-1, SSP2-2, SSP2-3, and SSP2-4 having a rhombic shape are illustrated as an example. However, embodiments are not limited thereto. The first sub-sensing patterns SSP1-6, SSP1-7, SSP1-8, SSP1-9, and SSP1-10, the second sub-sensing patterns SSP2-5, SSP2-6, SSP2-7, and SSP2-8, the third sub-sensing patterns SSP1-1, SSP1-2, SSP1-3, SSP1-4, and SSP1-5, and the fourth sub-sensing patterns SSP2-1, SSP2-2, SSP2-3, and SSP2-4 may have different polygonal shapes. The first sub-sensing patterns SSP1-6, SSP1-7, SSP1-8, SSP1-9, and SSP1-10, the second sub-sensing patterns SSP2-5, SSP2-6, SSP2-7, and SSP2-8, the third sub-sensing patterns SSP1-1, SSP1-2, SSP1-3, SSP1-4, and SSP1-5, and the fourth sub-sensing patterns SSP2-1, SSP2-2, SSP2-3, and SSP2-4 may each have a mesh shape.

First dummy patterns DSP1 may be disposed in first openings OP1 of first sensing patterns not corresponding to the first sub-sensing patterns SSP1-6, SSP1-7, SSP1-8, SSP1-9, and SSP1-10 and the third sub-sensing patterns SSP1-1, SSP1-2, SSP1-3, SSP1-4, and SSP1-5 among the first sensing patterns SP1. Second dummy patterns DSP2 may be disposed in second openings OP2 of second sensing patterns not corresponding to the second sub-sensing patterns SSP2-5, SSP2-6, SSP2-7, and SSP2-8 and the fourth sub-sensing patterns SSP2-1, SSP2-2, SSP2-3, and SSP2-4 among the second sensing patterns SP2. The first dummy patterns DSP1 and the second dummy patterns DSP2 may be in a floating state.

In an embodiment, the number of first sub-sensing patterns SSP1-6, SSP1-7, SSP1-8, SSP1-9, and SSP1-10 and the number of third sub-sensing patterns SSP1-1, SSP1-2, SSP1-3, SSP1-4, and SSP1-5 may be smaller than the number of first sensing patterns SP1. In an embodiment, the number of second sub-sensing patterns SSP2-5, SSP2-6, SSP2-7, and SSP2-8 and the number of fourth sub-sensing patterns SSP2-1, SSP2-2, SSP2-3, and SSP2-4 may be smaller than the number of second sensing patterns SP2.

The readout circuit ROC-1 may sense a user's body composition by a method (e.g., a mutual capacitance method) of transmitting a transmission signal to the first body composition sensing line BCL1 and receiving a reception signal from the second body composition sensing line BCL2, or vice versa. The area of the region where the first body composition sensing electrode BE1 and the second body composition sensing electrode BE2 are disposed is smaller than the entire area of the input sensor ISU-1. Accordingly, an error in body composition measurement due to noise may be minimized (or reduced) as compared with when the user's body composition is sensed using all of the first to tenth transmitting electrodes TE1 to TE10 and the first to fourteenth receiving electrodes RE1 to RE14. Thus, reliability of a measurement result on the user's body composition may be improved.

Figure 14:
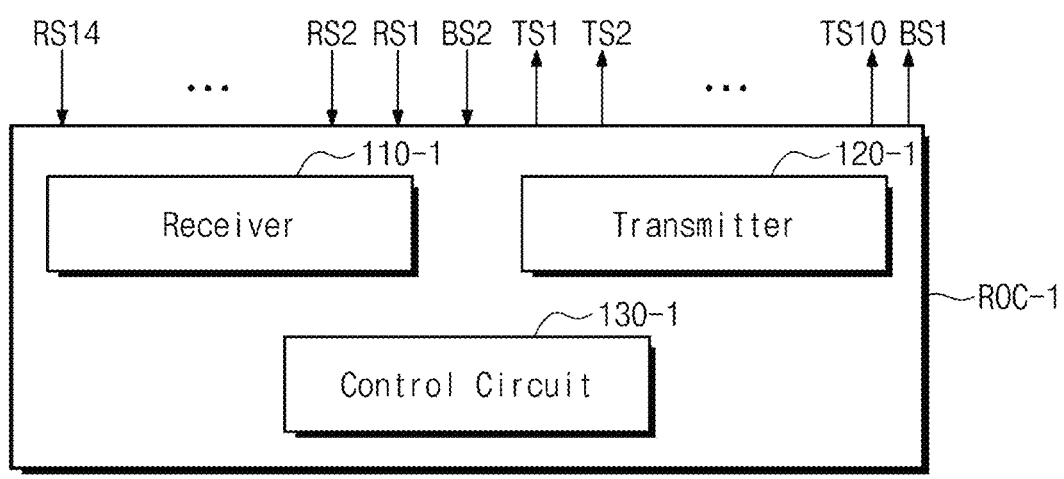
FIG. 14 is a block diagram of a readout circuit according to an embodiment.

FIG. 14 is a block diagram of the readout circuit ROC-1 according to an embodiment.

Referring to FIG. 14, the readout circuit ROC-1 includes a receiver 110-1, a transmitter 120-1, and a control circuit 130-1. The readout circuit ROC-1 illustrated in FIG. 14 is similar to the readout circuit ROC illustrated in FIG. 9, and therefore, repetitive descriptions will hereinafter be omitted.

In an embodiment, in response to control from the control circuit 130-1, the transmitter 120-1 transmits a body composition transmission signal BS1 to the first body composition sensing electrode BE1 through the first body composition sensing line BCL1 illustrated in FIG. 13A.

In an embodiment, the receiver 110-1 receives a body composition reception signal BS2 from the second body composition sensing electrode BE2 through the second body composition sensing line BCL2.

The readout circuit ROC-1 may control first to tenth transmission signals TS1 to TS10, first to fourteenth reception signals RS1 to RS14, the body composition transmission signal BS1, and the body composition reception signal BS2 depending on operating modes.

Figure 15A:
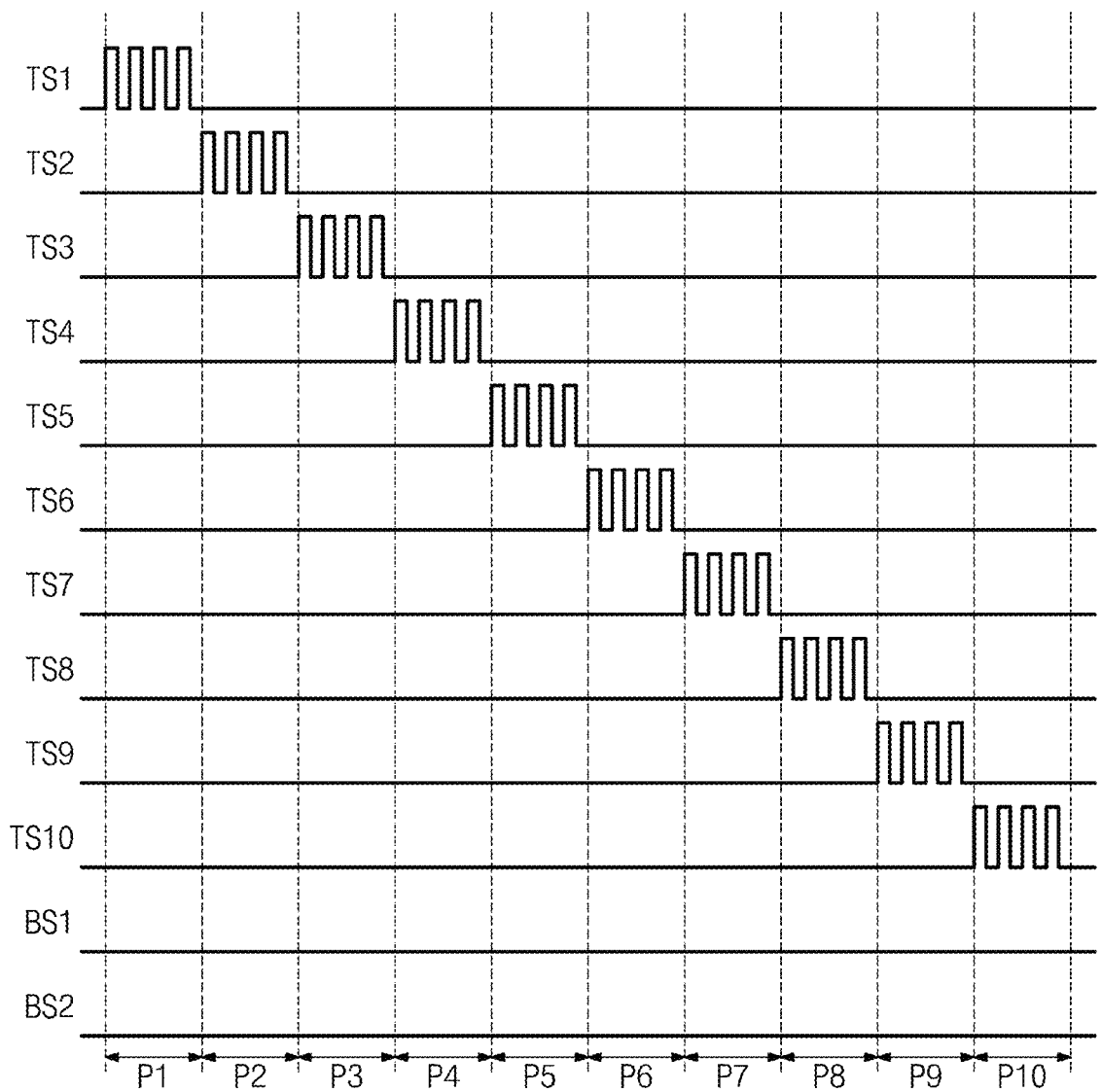
FIG. 15A is a timing chart illustrating first to tenth transmission signals provided to first to tenth transmitting lines and body composition signals provided to body composition sensing lines of the input sensor illustrated in FIG. 13A during a normal mode according to an embodiment.

FIG. 15A is a timing chart illustrating first to tenth transmission signals TS1 to TS10 provided to the first to tenth transmitting lines TL1 to TL10 and body composition signals BS1 and BS2 provided to the body composition sensing lines BCL1 and BCL2 of the input sensor ISU-1 illustrated in FIG. 13A during a normal mode according to an embodiment.

Figure 15B:
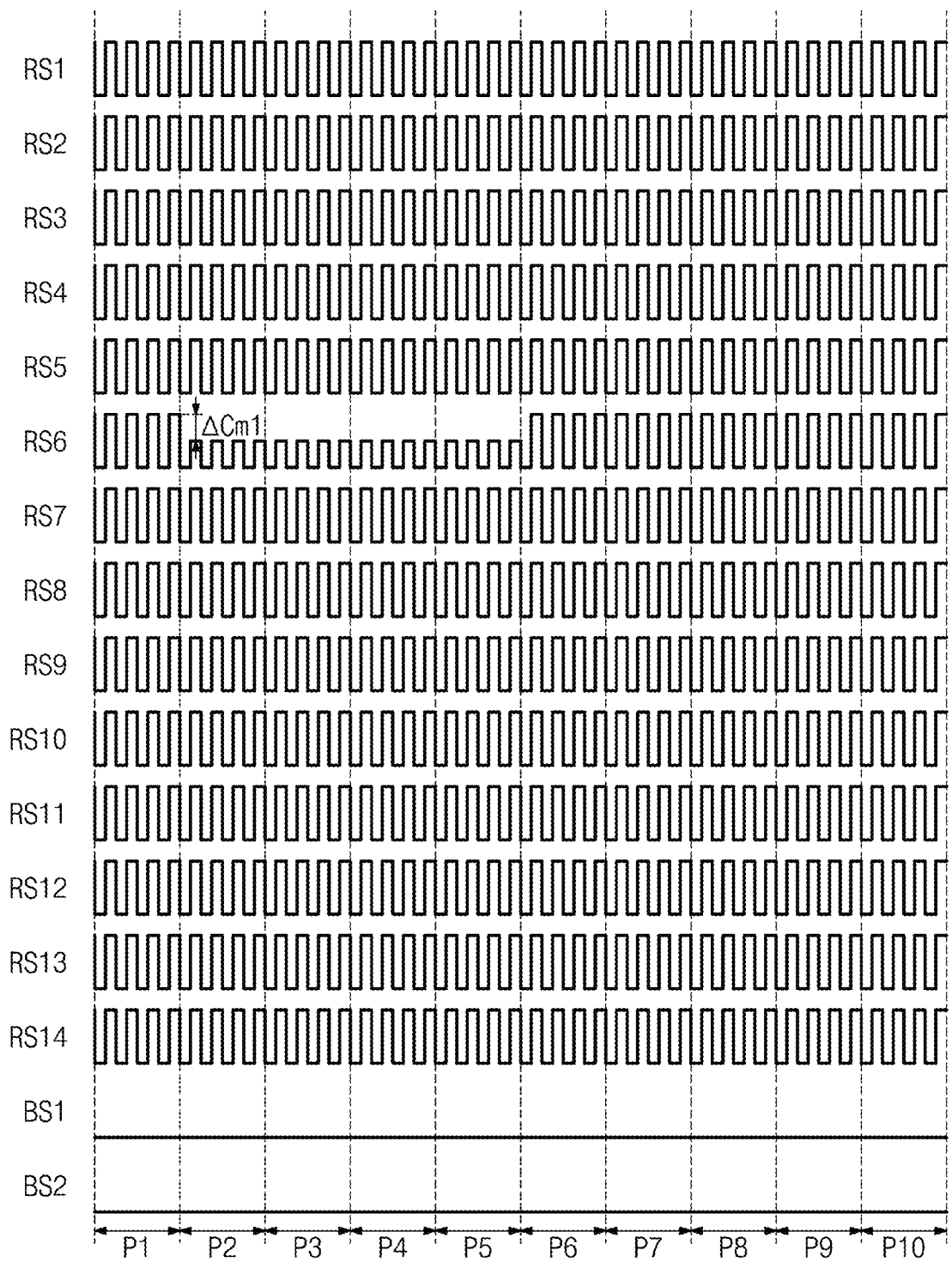
FIG. 15B is a timing chart illustrating reception signals received from first to fourteenth receiving lines and body composition signals received through the body composition sensing lines of the input sensor illustrated in FIG. 13A during the normal mode according to an embodiment.

FIG. 15B is a timing chart illustrating reception signals RS1 to RS14 received from the first to fourteenth receiving lines RL1 to RL14 and body composition signals BS1 and BS2 received through the body composition sensing lines BCL1 and BCL2 of the input sensor ISU-1 illustrated in FIG. 13A during the normal mode according to an embodiment.

Referring to FIGS. 13A, 14, 15A, and 15B, during the normal mode, the readout circuit ROC-1 may perform input sensing on the entire area of the input sensor ISU-1. In the normal mode, the control circuit 130-1 outputs the first to tenth transmission signals TS1 to TS10 to the first to tenth transmitting electrodes TE1 to TE10 through the transmitter 120-1 and receives the first to fourteenth reception signals RS1 to RS14 from the first to fourteenth receiving electrodes RE1 to RE14 through the receiver 110-1. The first to tenth transmission signals TS1 to TS10 may sequentially transition to an active level in first to tenth intervals P1 to P10.

In an embodiment, during the normal mode, each of the body composition transmission signal BS1 and the body composition reception signal BS2 may be at an inactive level (e.g., a low level). In an embodiment, during the normal mode, each of the body composition transmission signal BS1 and the body composition reception signal BS2 may be in a floating state. For instance, in the normal mode, the readout circuit ROC-1 may maintain the body composition transmission signal BS1 and the body composition reception signal BS2 at the inactive level or in the floating state.

Figure 16A:
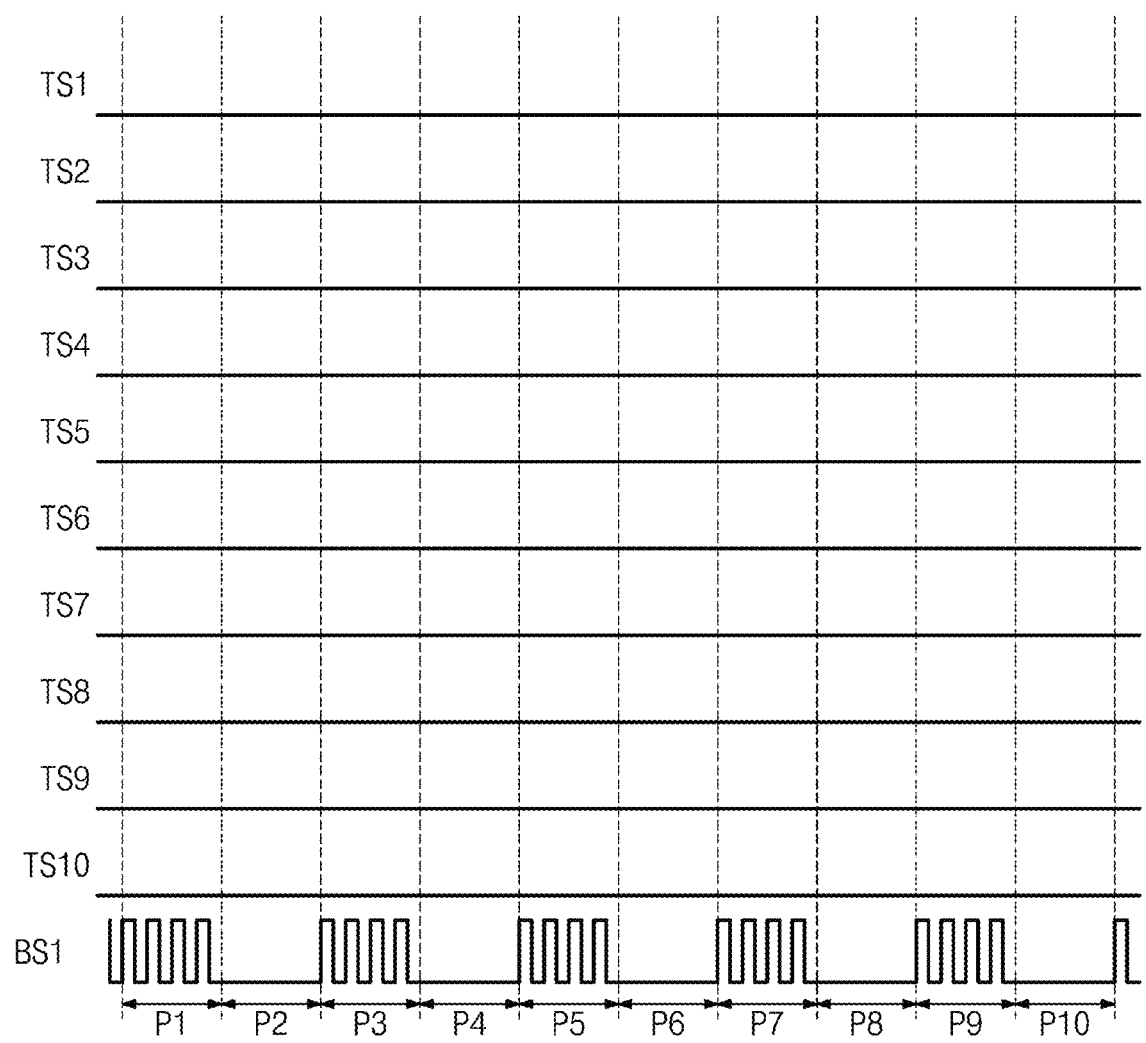
FIG. 16A is a timing chart illustrating first to tenth transmission signals provided to the first to tenth transmitting lines and a first body composition signal transmitted through a first body composition sensing line of the input sensor illustrated in FIG. 13A during a body composition measurement mode according to an embodiment.

FIG. 16A is a timing chart illustrating first to tenth transmission signals TS1 to TS10 provided to the first to tenth transmitting lines TL1 to TL10 and a body composition transmission signal BS1 transmitted through the first body composition sensing line BCL1 of the input sensor ISU-1 illustrated in FIG. 13A during a body composition measurement mode according to an embodiment.

Figure 16B:
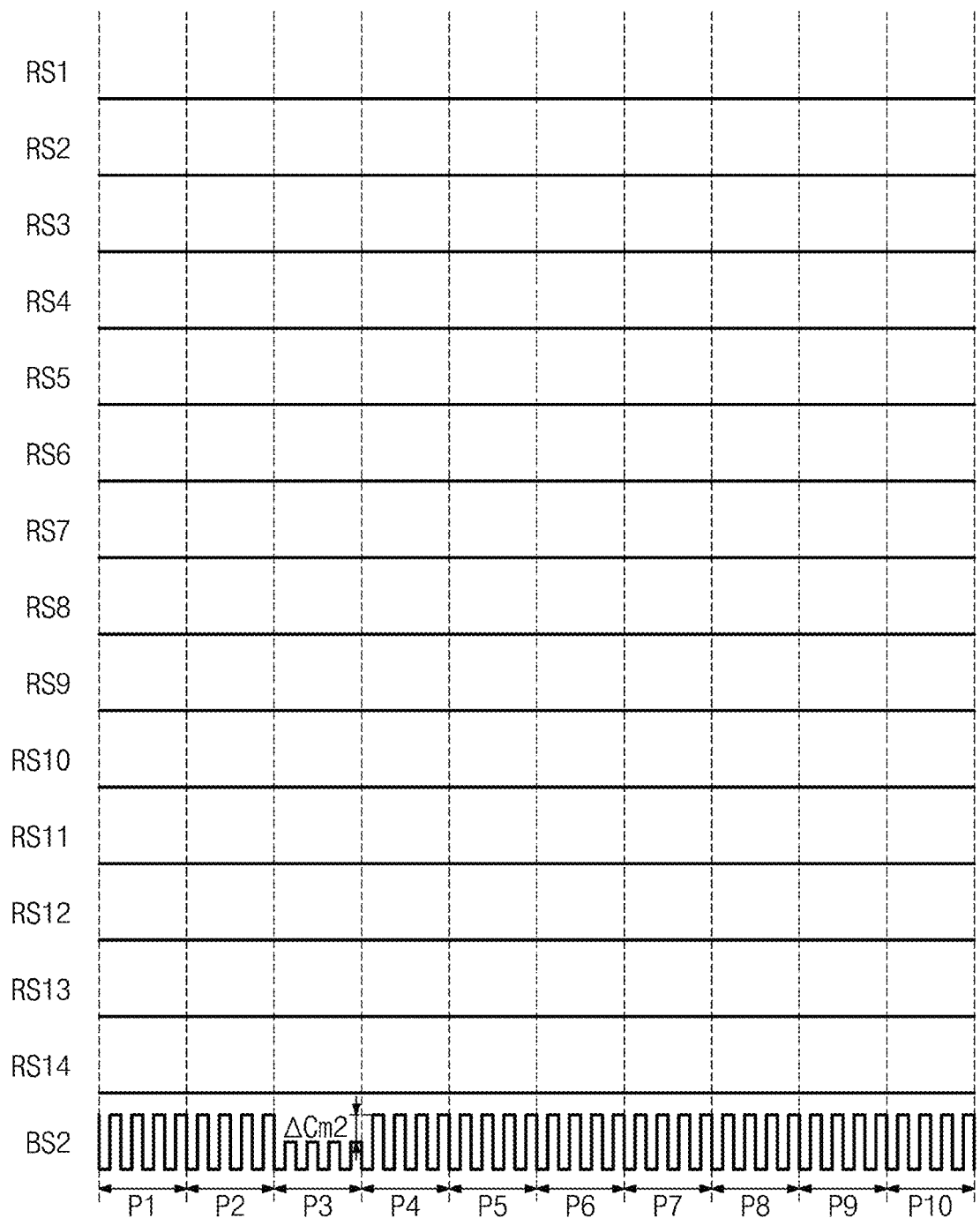
FIG. 16B is a timing chart illustrating reception signals received from the first to fourteenth receiving lines and a second body composition signal received through a second body composition sensing line of the input sensor illustrated in FIG. 13A during the body composition measurement mode according to an embodiment.

FIG. 16B is a timing chart illustrating reception signals RS1 to RS14 received from the first to fourteenth receiving lines RL1 to RL14 and a body composition reception signal BS2 received through the second body composition sensing line BCL2 of the input sensor ISU-1 illustrated in FIG. 13A during the body composition measurement mode according to an embodiment.

Referring to FIGS. 13A, 14, 16A, and 16B, during the body composition measurement mode, the first to tenth transmission signals TS1 to TS10 and the first to fourteenth reception signals RS1 to RS14 may be maintained at an inactive level (e.g., a low level) or in a floating state.

During the body composition measurement mode, the control circuit 130-1 in the readout circuit ROC-1 outputs the body composition transmission signal BS1 through the transmitter 120-1 and receives the body composition reception signal BS2 through the receiver 110-1.

The control circuit 130-1 is able to measure and analyze the user's body composition through a variation $\Delta Cm2$ in the body composition reception signal BS2 received through the receiver 110-1.

Although it has been described that the first body composition sensing electrode BE1 operates as the transmitting electrode and the second body composition sensing electrode BE2 operates as the receiving electrode, embodiments are not limited thereto. For instance, in an embodiment, the first body composition sensing electrode BE1 may operate as the receiving electrode and the second body composition sensing electrode BE2 may operate as the transmitting electrode.

As illustrated in FIGS. 13A and 13B, the first sub-sensing patterns SSP1-6, SSP1-7, SSP1-8, SSP1-9, and SSP1-10 and the second sub-sensing patterns SSP2-5, SSP2-6, SSP2-7, and SSP2-8 of the first body composition sensing electrode BE1 may be disposed adjacent to the first sub-sensing patterns SSP1-1, SSP1-2, SSP1-3, SSP1-4, and SSP1-5 and the second sub-sensing patterns SSP2-1, SSP2-2, SSP2-3, and SSP2-4 of the second body composition sensing electrode BE2.

The first body composition sensing electrode BE1 and the second body composition sensing electrode BE2 may have a first length (e.g., 3 cm to 4 cm) in the first direction DR1 and a second length (e.g., 3 cm to 4 cm) in the second direction DR2. As the region where the first body composition sensing electrode BE1 and the second body composition sensing electrode BE2 are disposed is limited, an error in body composition measurement due to noise may be minimized (or reduced). Accordingly, the reliability of a measurement result on the user's body composition may be improved.

Although it has been described that the readout circuit ROC-1 transmits the body composition transmission signal BS1 to the first body composition sensing electrode BE1 and receives the body composition reception signal BS2 from the second body composition sensing electrode BE2, embodiments are not limited thereto.

The readout circuit ROC-1 may sense the user's body composition by a self-capacitance method using only one of the first body composition sensing electrode BE1 and the second body composition sensing electrode BE2. In an embodiment, the readout circuit ROC-1 may transmit a body composition signal to the first body composition sensing electrode BE1 through the first body composition sensing line BCL1 and may receive a body composition signal from the first body composition sensing electrode BE1 through the first body composition sensing line BCL1. The readout circuit ROC-1 may measure the user's body composition by sensing a variation in the body composition signal received from the first body composition sensing electrode BE1.

In an embodiment, the readout circuit ROC-1 may transmit a body composition signal to the second body composition sensing electrode BE2 through the second body composition sensing line BCL2 and may receive a body composition signal from the second body composition sensing electrode BE2 through the second body composition sensing line BCL2. The readout circuit ROC-1 may measure the user's body composition by sensing a variation in the body composition signal received from the second body composition sensing electrode BE2.

Figure 17A:
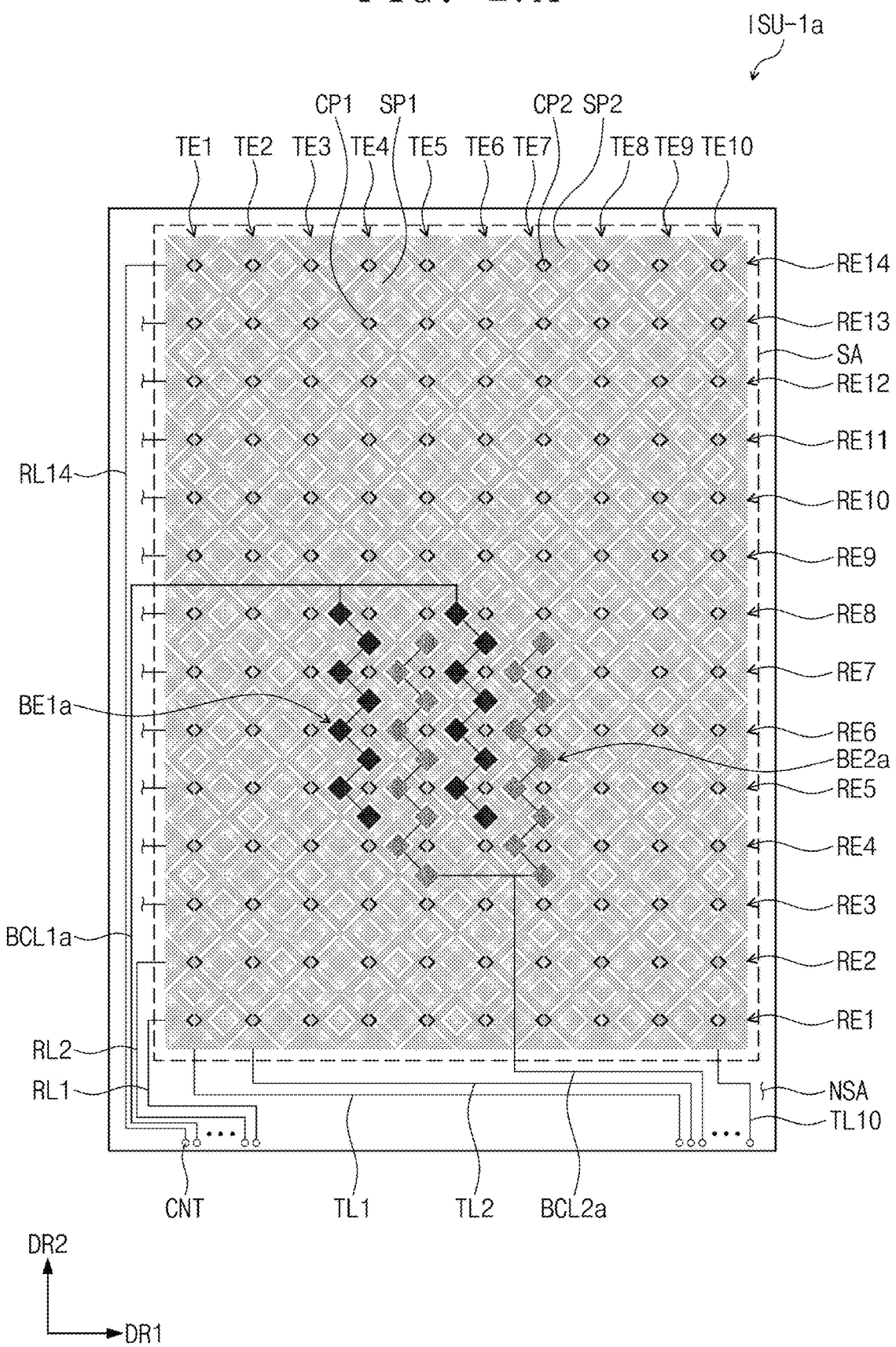
FIGS. 17A, 17B, and 17C are plan views illustrating configurations of input sensors according to various embodiments.
Figure 17B:
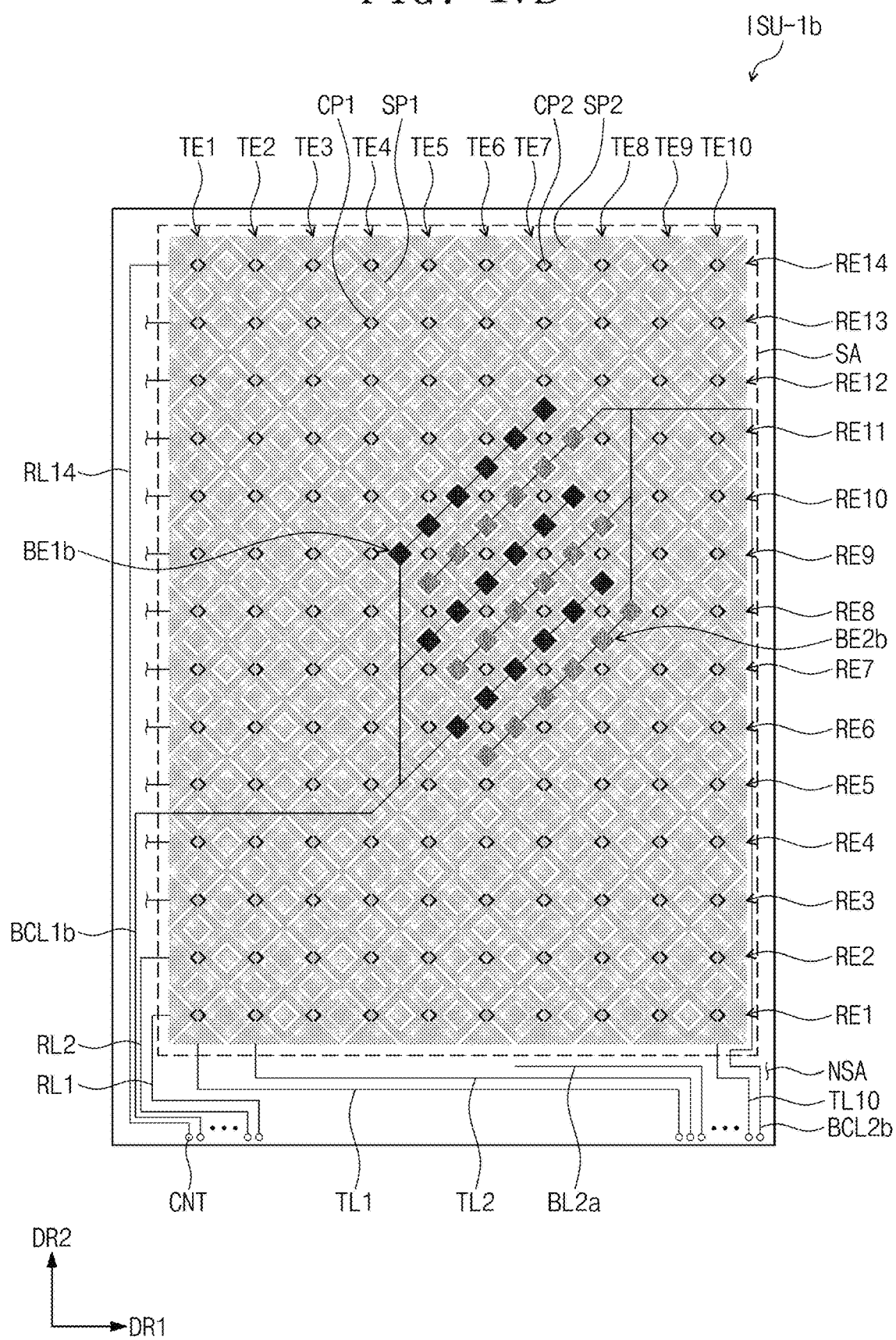
Figure 17C:
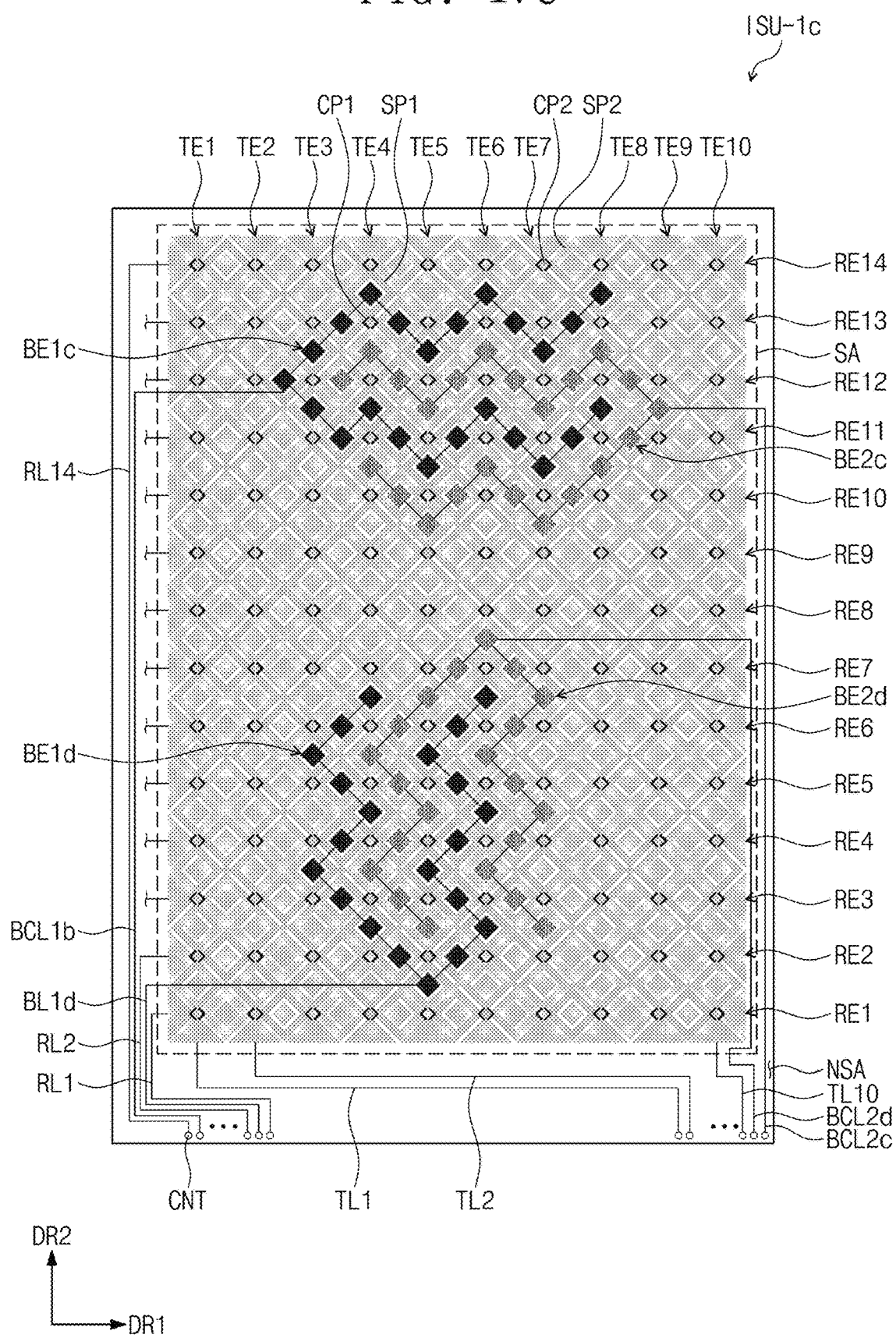

FIGS. 17A, 17B, and 17C are plan views illustrating configurations of input sensors ISU-1a, ISU-1b, and ISU-1c according to various embodiments.

The input sensor ISU-1a illustrated in FIG. 17A includes a first body composition sensing electrode BE1a, a second body composition sensing electrode BE2a, a first body composition sensing line BCL1a, and a second body composition sensing line BCL2a.

The input sensor ISU-1b illustrated in FIG. 17B includes a first body composition sensing electrode BE1b, a second body composition sensing electrode BE2b, a first body composition sensing line BCL1b, and a second body composition sensing line BCL2b.

The input sensor ISU-1c illustrated in FIG. 17C includes a first body composition sensing electrode BE1c, a second body composition sensing electrode BE2c, a first body composition sensing line BCL1c, a second body composition sensing line BCL2c, a first body composition sensing electrode BE1d, a second body composition sensing electrode BE2d, a first body composition sensing line BCL1d, and a second body composition sensing line BCL2d.

As illustrated in FIGS. 13A, 17A, 17B, and 17C, the sizes, numbers, and shapes of the first body composition sensing electrodes BE1, BE1a, BE1b, BE1c, and BE1d and the second body composition sensing electrodes BE2, BE2a, BE2b, BE2c, and BE2d may be diversely changed.

Figure 18:
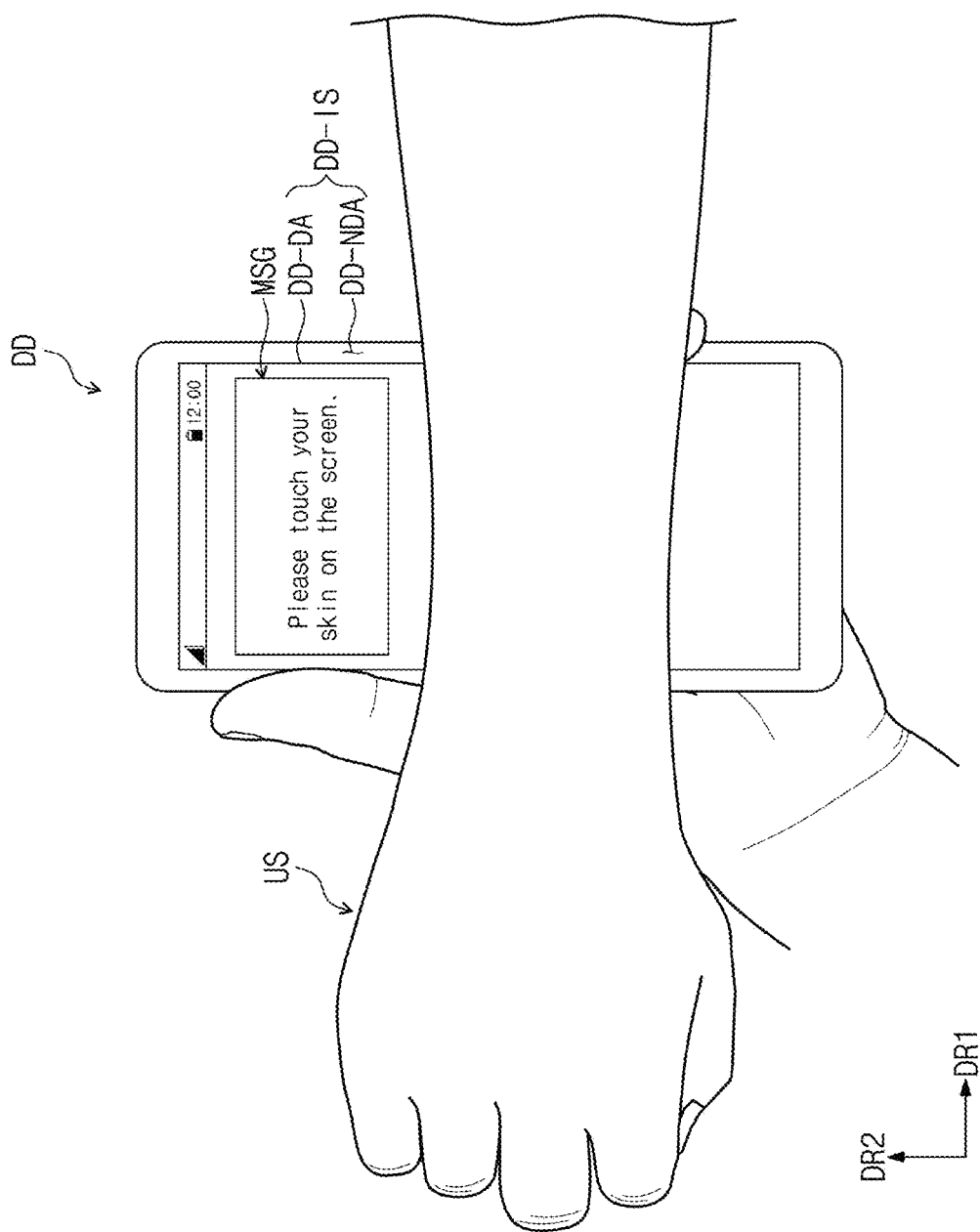
FIG. 18 is a view illustrating measurement of a skin state of a user via a display device according to an embodiment.

FIG. 18 is a view illustrating measurement of a skin state of a user via a display device according to an embodiment.

As illustrated in FIG. 18, in a skin measurement mode, the display device DD may display a message MSG indicating the start of the skin measurement mode on the display area DD-DA of the display surface DD-IS. In the state of holding the display device DD with one hand, the user US identifies the message MSG and brings the skin of a part of the user's body to be measured into contact with the display area DD-DA of the display device DD. For example, as illustrated in FIG. 18, the user US may bring an arm into contact with the display area DD-DA of the display device DD. Although FIG. 18 illustrates an example that the user US measures the moisture level for the inside of the wrist of the arm, embodiments are not limited thereto. The user US may measure the skin moisture levels for various parts, such as the face, the legs, the abdomen, and/or the like.

The display device DD may measure the moisture level of the area brought into contact with the image area DD-DA of the display device DD by the user US and may display an outcome of the measurement.

When the skin of a part of the user's body is brought into direct contact with the display surface DD-IS, a change in capacitance occurs due to the difference in permittivity between moisture in the skin and air. The display device DD may sense the capacitance change and may measure the amount of moisture in the skin.

When the wide area of the skin of the user US is brought into contact with the display surface DD-IS as illustrated in FIG. 18, a plurality of receiving electrodes RE1 to RE14 may be capacitively coupled with one transmitting electrode (e.g., TE1) at the same time. In this case, it may be difficult to accurately measure a body composition. In particular, noise components may be included in a reception signal with an increase in the area by which the skin of the user US is brought into contact with the display surface DD-IS.

The display device DD according to various embodiment may measure the moisture level of the user's skin by the self-capacitance method illustrated in FIGS. 7A to 12B, thereby improving sensing sensitivity.

In addition, the display device DD according to various embodiments may measure the moisture level of the user's skin by the mutual capacitance method using the first body composition sensing electrode and the second body composition sensing electrode as illustrated in FIGS. 13A to 17C. The areas of the first body composition sensing electrode and the second body composition sensing electrode may be smaller than the area of the input sensor. Accordingly, an error in body composition measurement due to noise may be minimized or reduced.

According to various embodiments, a display device having one or more of the above-described configurations may measure the moisture level of a user's skin and may display an outcome of the measurement via the display panel. Accordingly, user convenience in using the display device may be improved.

According to various embodiments, a display device may measure the moisture level of a user's skin by a self-capacitance method, thereby improving sensing sensitivity.

The display device according to various embodiments may measure the moisture level of a user's skin by a mutual capacitance method using the first body composition sensing electrode and the second body composition sensing electrode. The areas of the first body composition sensing electrode and the second body composition sensing electrode may be smaller than the area of the input sensor. As the areas of the first body composition sensing electrode and the second body composition sensing electrode are limited, an error in body composition measurement due to noise may be minimized or reduced. Accordingly, the display device may provide an accurate moisture-level measurement result.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a display panel; and
   an input sensor disposed on the display panel, the input sensor comprising a first electrode, a second electrode, and a third electrode, wherein the first electrode comprises a first sensing pattern having a first opening defined therein,
wherein the second electrode comprises a second sensing pattern having a second opening defined therein,
wherein the third electrode comprises:
   a first sub-sensing pattern disposed in the first opening of the first sensing pattern; and
   a second sub-sensing pattern disposed in the second opening of the second sensing pattern,
wherein the first sub-sensing pattern and the second sub-sensing pattern are electrically connected with each other, and
wherein the first electrode, the second electrode, and the third electrode are insulated from one another.

2. The display device of claim 1, further comprising:
a readout circuit electrically connected to the input sensor, wherein the input sensor further comprises:
   a first sensing line connected between the first electrode and the readout circuit;
   a second sensing line connected between the second electrode and the readout circuit; and
   a third sensing line connected between the third electrode and the readout circuit.

3. The display device of claim 2, wherein, in a first mode, the readout circuit is configured to transmit a transmission signal to the first sensing line and receive a sensing signal from the second sensing line.

4. The display device of claim 3, wherein, in the first mode, the readout circuit is configured to maintain the third sensing line at an inactive level.

5. The display device of claim 2, wherein, in a second mode, the readout circuit is configured to output a body composition transmission signal to the third sensing line and receive a body composition sensing signal from the third sensing line.

6. The display device of claim 5, wherein, in the second mode, the readout circuit is configured to maintain the first sensing line and the second sensing line at an inactive level.

7. The display device of claim 1, wherein the input sensor further comprises a connecting pattern electrically connecting the first sub-sensing pattern and the second sub-sensing pattern.

8. The display device of claim 7, wherein the input sensor further comprises:
   a first conductive layer comprising the first sensing pattern, the second sensing pattern, the first sub-sensing pattern, and the second sub-sensing pattern;
   an insulating layer disposed on the first conductive layer; and
   a second conductive layer disposed on the insulating layer, the second conductive layer comprising the connecting pattern.

9. The display device of claim 8, wherein the connecting pattern of the second conductive layer is electrically connected to the first sub-sensing pattern and the second sub-sensing pattern of the first conductive layer through a first contact hole and a second contact hole, the first contact hole and the second contact hole being formed through the insulating layer.

10. The display device of claim 1, wherein each of the first electrode, the second electrode, and the third electrode has a mesh shape.

11. The display device of claim 1, wherein:
the first electrode comprises a plurality of first sensing patterns, each of the plurality of first sensing patterns comprising a corresponding first opening;
the second electrode comprises a plurality of second sensing patterns, each of the plurality of second sensing patterns comprising a corresponding second opening,
a portion of the plurality of first sensing patterns corresponds to the first sub-sensing pattern, and
a portion of the plurality of second sensing patterns corresponds to the second sub-sensing pattern.

12. The display device of claim 11, wherein the input sensor further comprises:
first dummy sensing patterns disposed in first openings of first sensing patterns not corresponding to the first sub-sensing pattern among the plurality of first sensing patterns; and
second dummy sensing patterns disposed in second openings of second sensing patterns not corresponding to the second sub-sensing pattern among the plurality of second sensing patterns.

13. A display device comprising:
a display panel; and
an input sensor disposed on the display panel, the input sensor comprising a first electrode, a second electrode, a third electrode, and a fourth electrode,
wherein the first electrode comprises a first sensing pattern having a first opening defined therein,
wherein the second electrode comprises a second sensing pattern having a second opening defined therein,
wherein the third electrode comprises:
   a first sub-sensing pattern disposed in the first opening of the first sensing pattern; and
   a second sub-sensing pattern disposed in the second opening of the second sensing pattern,
wherein the fourth electrode comprises:
   a third sub-sensing pattern disposed in the first opening of the first sensing pattern; and
   a fourth sub-sensing pattern disposed in the second opening of the second sensing pattern,
wherein the first sub-sensing pattern and the second sub-sensing pattern are electrically connected to each other,
wherein the third sub-sensing pattern and the fourth sub-sensing pattern are electrically connected to each other, and
wherein the first electrode, the second electrode, the third electrode, and the fourth electrode are insulated from one another.

14. The display device of claim 13, further comprising:
a readout circuit electrically connected to the input sensor, wherein the input sensor further comprises:
   a first sensing line connected between the first electrode and the readout circuit;
   a second sensing line connected between the second electrode and the readout circuit;
   a third sensing line connected between the third electrode and the readout circuit; and
   a fourth sensing line connected between the fourth electrode and the readout circuit.

15. The display device of claim 14, wherein:
the readout circuit is configured, in a first mode, to output a transmission signal to the first sensing line and receive a sensing signal from the second sensing line; and
the readout circuit is configured, in the first mode, to maintain the third sensing line and the fourth sensing line at an inactive level.

16. The display device of claim 14, wherein:
the readout circuit is configured, in a second mode, to transmit a body composition transmission signal to the third sensing line and receive a body composition sensing signal from the fourth sensing line; and the readout circuit is configured, in the second mode, to maintain the first sensing line and the second sensing line at an inactive level.

17. The display device of claim 13, wherein the input sensor further comprises:
   a first connecting pattern electrically connecting the first sub-sensing pattern and the second sub-sensing pattern; and
   a second connecting pattern electrically connecting the third sub-sensing pattern and the fourth sub-sensing pattern.

18. The display device of claim 13, wherein each of the first electrode, the second electrode, the third electrode, and the fourth electrode has a mesh shape.

19. The display device of claim 13, wherein:
   the first electrode comprises a plurality of first sensing patterns, each of the plurality of first sensing patterns comprising a corresponding first opening;
   the second electrode comprises a plurality of second sensing patterns, each of the plurality of second sensing patterns comprising a corresponding second opening;
   a portion of the plurality of first sensing patterns corresponds to the first sub-sensing pattern and the third sub-sensing pattern; and
   a portion of the plurality of second sensing patterns corresponds to the second sub-sensing pattern and the fourth sub-sensing pattern.

20. The display device of claim 19, wherein the input sensor further comprises:
   first dummy sensing patterns disposed in first openings of first sensing patterns not corresponding to the first sub-sensing pattern and the third sub-sensing pattern among the plurality of first sensing patterns; and
   second dummy sensing patterns disposed in second openings of second sensing patterns not corresponding to the second sub-sensing pattern and the fourth sub-sensing pattern among the plurality of second sensing patterns.

* * * * *